United States Patent
Pan et al.

(10) Patent No.: US 12,101,424 B2
(45) Date of Patent: Sep. 24, 2024

(54) ELECTRONIC DEVICE HAVING FOLDABLE SCREEN AND DISPLAY METHOD

(71) Applicant: Huawei Technologies Co., Ltd., Shenzhen (CN)

(72) Inventors: Xinglong Pan, Shenzhen (CN); Zhen Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 250 days.

(21) Appl. No.: 17/682,182

(22) Filed: Feb. 28, 2022

(65) Prior Publication Data
US 2022/0191313 A1    Jun. 16, 2022

Related U.S. Application Data

(63) Continuation of application No. PCT/CN2020/108132, filed on Aug. 10, 2020.

(30) Foreign Application Priority Data

Aug. 30, 2019   (CN) .......................... 201910818482.4

(51) Int. Cl.
*H05K 5/00* (2006.01)
*H04M 1/02* (2006.01)
(Continued)

(52) U.S. Cl.
CPC ..... *H04M 1/0268* (2013.01); *H04M 1/72403* (2021.01); *H05K 1/028* (2013.01); *H05K 5/0017* (2013.01)

(58) Field of Classification Search
None
See application file for complete search history.

(56) References Cited

U.S. PATENT DOCUMENTS

| | | |
|---|---|---|
| 2016/0209569 A1 | 7/2016 | Cho et al. |
| 2017/0325038 A1 | 11/2017 | Yu et al. |

(Continued)

FOREIGN PATENT DOCUMENTS

| | | |
|---|---|---|
| CN | 203133680 U | 8/2013 |
| CN | 2016062110 A | 4/2016 |

(Continued)

OTHER PUBLICATIONS

ITU-T H.264, Jun. 2019, "Series H: Audiovisual and Multimedia Systems, Infrastructure of audiovisual services—Coding of moving video, Advanced video coding for generic audiovisual services," 836 pages.

*Primary Examiner* — Anthony Q Edwards
*Assistant Examiner* — Rashen E Morrison
(74) *Attorney, Agent, or Firm* — Conley Rose, P.C.

(57) ABSTRACT

An electronic device having a foldable screen, where when the foldable screen is in a folded state, the foldable screen is divided into a primary screen and a secondary screen. When a first component disposed on the primary screen is in a working state, or an application that invokes the first component is in the working state, when a screen switching event is detected, the electronic device is prohibited from switching to a state in which only the secondary screen performs display, to avoid a case in which a user is close to the primary screen but the primary screen does not perform display.

19 Claims, 26 Drawing Sheets

(51) Int. Cl.
    *H04M 1/72403*    (2021.01)
    *H05K 1/02*    (2006.01)

(56) References Cited

U.S. PATENT DOCUMENTS

| | | | |
|---|---|---|---|
| 2018/0198896 A1* | 7/2018 | Kang | G06F 1/1652 |
| 2018/0329508 A1 | 11/2018 | Klein et al. | |
| 2018/0331991 A1* | 11/2018 | Kim | G06F 3/0486 |
| 2019/0012000 A1* | 1/2019 | Cavallaro | G06F 1/1626 |
| 2019/0042066 A1* | 2/2019 | Kim | H04M 1/725 |
| 2020/0371820 A1 | 11/2020 | Chen et al. | |
| 2021/0089202 A1 | 3/2021 | Sim et al. | |
| 2022/0004460 A1* | 1/2022 | Pan | G06F 11/0742 |
| 2022/0191313 A1* | 6/2022 | Pan | G06F 1/1641 |

FOREIGN PATENT DOCUMENTS

| | | |
|---|---|---|
| CN | 106775536 A | 5/2017 |
| CN | 107943399 A | 4/2018 |
| CN | 108196749 A | 6/2018 |
| CN | 108418920 A | 8/2018 |
| CN | 108646938 A | 10/2018 |
| CN | 108769418 A | 11/2018 |
| CN | 108848317 A | 11/2018 |
| CN | 109086018 A | 12/2018 |
| CN | 109391739 A | 2/2019 |
| CN | 109889670 A | 6/2019 |
| CN | 109981839 A | 7/2019 |
| CN | 110083270 A | 8/2019 |
| CN | 110602315 A | 12/2019 |
| EP | 3896946 A1 | 10/2021 |
| TW | 201907283 A | 2/2019 |
| WO | 2019151618 A1 | 8/2019 |

* cited by examiner

ELECTRONIC DEVICE HAVING FOLDABLE SCREEN AND DISPLAY METHOD

CROSS-REFERENCE TO RELATED APPLICATIONS

This is a continuation of International Patent Application No. PCT/CN2020/108132 filed on Aug. 10, 2020, which claims priority to Chinese Patent Application No. 201910818482.4 filed on Aug. 30, 2019. The disclosures of the aforementioned applications are hereby incorporated by reference in their entireties.

TECHNICAL FIELD

This disclosure relates to the field of terminal technologies, and in particular, to an electronic device having a foldable screen and a display method.

BACKGROUND

Mobile phones having foldable screens are increasingly common, and a user can fold a display (or a screen) at an angle along a folding line when using such a mobile phone. As shown in FIG. 1, the display may be divided into two display areas: a left display area and a right display area, and therefore display manners of the mobile phone are more diversified. For example, only the left display area may be used for display, or only the right display area may be used for display, or the two display areas may be used as one screen for display.

In the conventional technology, there are a plurality of manners of controlling display of a mobile phone. For example, one or two display areas are selected for display based on a form (for example, unfolded or folded) of the mobile phone that is detected by a sensor. For another example, a display area facing a user is selected for display based on a holding posture of the user.

However, some components in some mobile phones are located near only one of the two display areas (for example, an earpiece is located above the right display area and there is no earpiece near the left display area), and the display control manner is relatively simple. For example, a same display control manner is used for a scenario in which an earpiece is required and a scenario in which an earpiece is not required. Consequently, a required earpiece may not be in a display area that is performing display, and inconvenience is caused to the user.

SUMMARY

This application provides an electronic device having a foldable screen and a display method. For some components located on only one screen of a primary screen and a secondary screen, impact of use statuses of these components on a display manner of the electronic device is considered, and a more flexible display control manner is provided, and can adapt to more application scenarios.

The following technical solutions are used in this application.

According to a first aspect, an embodiment of the present disclosure provides a display method, applied to an electronic device having a foldable screen. When the foldable screen is in a folded state, the foldable screen is divided into a primary screen and a secondary screen. The method includes that the electronic device detects a screen switching event in a first screen-on state. The electronic device determines whether a first component in the electronic device is in a working state. The first component is disposed only on one screen of the primary screen and the secondary screen. If a first condition is met, the electronic device is set to a second screen-on state. The first condition includes that the first component is in the working state. If a second condition is met, the electronic device is set to a third screen-on state. The second condition includes that the first component is in a non-working state, or the second condition includes that the first component is in the working state and a second component is in the working state, and the second component is located on the other screen of the primary screen and the secondary screen. The second screen-on state is different from the third screen-on state.

Because some components are disposed on only one screen, when these components are in the working state, a user usually needs to be close to the screen to have better use experience, and when these components do not work, the user does not need to be close to the screen. In consideration of such a difference, if the electronic device is in the first screen-on state and the screen switching event is detected when the first component works, the screen is set to the second screen-on state. If the electronic device is in the first screen-on state and the first component does not work, or when a component located on the other screen also works, the screen is set to the third screen-on state. Because the second screen-on state is different from the third screen-on state, corresponding display settings are performed for different application scenarios.

In a possible implementation, the first component is disposed only on the primary screen, the second screen-on state does not include secondary-screen display, and the third screen-on state includes the secondary-screen display. For a component disposed on the primary screen, when the component is in the working state, the user usually needs to be close to or facing the primary screen to have better use experience. Therefore, a manner in which the primary screen does not perform display (that is, the secondary-screen display) is avoided. This more conforms to an operation habit of the user.

Optionally, the component is an earpiece. For example, the earpiece may be set above the primary screen. When using the earpiece to make a call, the user needs to switch the primary screen close to the user, and during the call, the user may need to operate the mobile phone. Therefore, if the screen switching event is detected, to facilitate the operation of the user, it should be ensured that the primary screen performs display, such as primary-screen display, large-screen display, or folded dual-screen display, to avoid that the primary screen does not perform display (that is, the secondary-screen display).

In a possible implementation, a use status of the second component is further considered. The second component is a camera, and the camera is disposed only on the secondary screen of the electronic device. The first condition is that the earpiece is in the working state, and the camera of the electronic device is in a non-working state. In this implementation, the secondary-screen display is avoided only when the earpiece works but the camera does not work.

In a possible implementation, if the earpiece is in the working state and the camera is in the working state, the secondary screen may need to be used to perform a selfie function or the like, and secondary-screen display only is allowed. In this implementation, a more refined use scenario is considered, so that the user can conveniently use the selfie function or the like during a call or the like.

In a possible implementation, a status of an intelligent screen switching switch is further considered. Because the intelligent switch is turned on, the screen switching event may be triggered when the user intentionally or unintentionally changes a status of the electronic device. Therefore, the secondary-screen display is avoided only when the intelligent switch is turned on, the earpiece is in the working state, and the camera of the electronic device is in the non-working state. This determining manner can reduce misoperations after the intelligent switch is turned on.

In a possible implementation, the first component is a microphone disposed only on the primary screen. A description of this solution is similar to the description of the foregoing solution of the earpiece, a difference lies in that determining a working status of the earpiece is replaced with determining a working status of the microphone.

Optionally, the second component is the camera. Secondary-screen display only is avoided when the microphone is in the working state and the camera is in the non-working state. The secondary-screen display is allowed when the microphone is in the working state and the camera is in the working state. This can ensure a better use effect when the user uses the microphone, and it is also convenient for the user to use the selfie function or the like when using the microphone.

In a possible implementation, the first component is an infrared sensor disposed only on the primary screen. A description of this solution is similar to the description of the foregoing solution of the earpiece, a difference lies in that determining the working status of the earpiece is replaced with determining a working status of the infrared sensor. Optionally, the second component is the camera. The secondary-screen display only is avoided when the infrared sensor is in the working state and the camera is in the non-working state. The secondary-screen display is allowed when the infrared sensor is in the working state and the camera is in the working state. This ensures that the user can properly use a facial recognition function or the like by using the infrared sensor, and it is also convenient for the user to use the selfie function or the like when using the microphone.

In a possible implementation, the first screen-on state includes the primary-screen display, the secondary-screen display, the large-screen display, or the folded dual-screen display, the second screen-on state includes the primary-screen display, the large-screen display, or the folded dual-screen display, and the third screen-on state includes the primary-screen display, the secondary-screen display, the large-screen display, or the folded dual-screen display. The first screen-on state is different from the second screen-on state, and the first screen-on state is different from the third screen-on state.

In a possible implementation, the first component is disposed only on the secondary screen, the second screen-on state does not include the primary-screen display, and the third screen-on state includes the primary-screen display. The first component is the camera. Different from the foregoing component disposed only on the secondary screen, this implementation considers a component disposed only on the primary screen. For the component disposed only on the secondary screen, when the component is in the working state, the user usually needs to be close to or facing the secondary screen to have better use experience. Therefore, a manner in which the secondary screen does not perform display (that is, the primary-screen display) is avoided. This more conforms to the operation habit of the user.

Optionally, a working status of a component such as the earpiece, the microphone, the infrared sensor, or an optical proximity sensor disposed only on the primary screen may be further considered. When the camera works and these components are in the working state, it is more convenient for the user to operate when the primary-screen display is allowed.

According to a second aspect, an embodiment of the present disclosure provides a display method. When a foldable screen of an electronic device is in a folded state, the foldable screen is divided into a primary screen and a secondary screen. The electronic device detects a screen switching event in a first screen-on state or detects a screen-on event when the screen is off. If the electronic device is in a calling state and a camera of the electronic device is in a non-working state, the electronic device is set to a second screen-on state. If the electronic device is in the calling state and the camera of the electronic device is in a working state, the electronic device is set to a third screen-on state. An earpiece of the electronic device is disposed only on the primary screen of the electronic screen, and the camera of the electronic device is disposed only on the secondary screen of the electronic device. The second screen-on state is different from the third screen-on state, the second screen-on state does not include secondary-screen display, and the third screen-on state includes the secondary-screen display. In this implementation, if the electronic device is in the first screen-on state, whether to avoid the secondary-screen display is determined based on a call status and a working status of the camera. The call status may be determined based on whether a call application is running or whether the call application is displayed in the foreground, or based on a call-related event, or based on a working status of a component such as the earpiece or a microphone that may be used during a call. In this implementation, when the electronic device receives the screen switching event or the screen-on event when the camera is not used during the call, the secondary-screen display is avoided, so that a user can operate the primary screen during the call. However, when the electronic device receives the screen switching event or the screen-on event when the camera is used during the call, the secondary-screen display is allowed, so that the user can conveniently use a selfie function or the like during the call. Therefore, this implementation is more flexible, and is applicable to more application scenarios.

In an optional implementation, whether a headset is used may be further considered. If the electronic device does not use the headset to make the call, and the camera is in the non-working state, the electronic device is set to the second screen-on state, that is, the secondary-screen display is avoided. In this implementation, it is considered that the secondary-screen display is avoided only when the user needs to use the earpiece to be close to the primary screen, and when the headset is used for the call, the secondary-screen display may not be avoided. Therefore, in this implementation, a use scenario of the user is more accurately identified, and a use requirement of the user is better met.

According to a third aspect, an embodiment of the present disclosure provides a display method, applied to an electronic device having a foldable screen. When the foldable screen is in a folded state, the foldable screen is divided into a primary screen and a secondary screen. The electronic device displays an interface of a first application in a first screen-on state. The first application starts a first component, and the first component is disposed only on the primary screen. The electronic device detects a first screen switching event. In response to the first screen switching event, the electronic device is set to a second screen-on state. The second screen-on state does not include secondary-screen display. The first electronic device displays an interface of a second application in the first screen-on state. The second application does not start the first component. The electronic device detects a second screen switching event. In response to the second screen switching event, the electronic device is set to the secondary-screen display. In this implementation, whether to limit the secondary-screen display is determined based on whether the interface of the application enabling the first component is displayed in the foreground, instead of directly determining a working status of the first component. The first application may be set by a manufacturer of the electronic device, an operating system of the electronic device, or a provider of a screen switching control function. Alternatively, a user may set which applications the first application is. This implementation is more flexible.

Optionally, the first application is a call application or an audio and video application (for example, a music player or a video player), and the first component is an earpiece.

Optionally, the first application is a facial recognition application or function, and the first component is an infrared sensor used for facial recognition.

According to a fourth aspect, an embodiment of the present disclosure provides a display method, applied to an electronic device having a foldable screen. When the foldable screen is in a folded state, the foldable screen is divided into a primary screen and a secondary screen. The electronic device displays an interface of a first application in a first screen-on state. The first application starts a first component, and the first component is disposed only on the secondary screen. The electronic device detects a first screen switching event. In response to the first screen switching event, the electronic device is set to a second screen-on state. The second screen-on state does not include primary-screen display. The first electronic device displays an interface of a second application in the first screen-on state. The second application does not start the first component. The electronic device detects a second screen switching event. In response to the second screen switching event, the electronic device is set to the primary-screen display. Different from the third aspect, in the fourth aspect, whether to limit the primary-screen display is determined based on whether the interface of the application enabling the first component is displayed in the foreground. The first application may be set by a manufacturer of the electronic device, an operating system of the electronic device, or a provider of a screen switching control function. Alternatively, a user may set which applications the first application is (for example, set by using the interface in FIG. 15). This implementation is more flexible.

Optionally, the interface of the first application is an interface of a camera application, and the first component is a camera.

According to a fifth aspect, an embodiment of the present disclosure provides a display method, applied to an electronic device having a foldable screen. When the foldable screen is in a folded state, the foldable screen is divided into a primary screen and a secondary screen. The method includes, when a first screen switching event is detected, if the electronic device is displaying an interface of a first application in a first screen-on state, the electronic device is set to a second screen-on state, or if the first electronic device is displaying an interface of a second application in the first screen-on state, the electronic device is set to a third screen-on state. The first application is different from the second application, and the second screen-on state is different from the third screen-on state. It may be understood that, in this solution, based on an application running in the foreground, different screen-on states may be switched to. A correspondence between the application running in the foreground and a screen-on state may be set by a user. For example, refer to the interface shown in FIG. 15.

Optionally, the first application is a call application or a facial recognition application, and the second screen-on state does not include secondary-screen display.

Optionally, the second application is a camera application, and the third screen-on state does not include primary-screen display.

Optionally, the first application starts a first component, and the first component is disposed only on the secondary screen or only on the primary screen.

According to a sixth aspect, an embodiment of the present disclosure provides a display method, applied to an electronic device having a foldable screen. When the foldable screen is in a folded state, the foldable screen is divided into a primary screen and a secondary screen. An earpiece of the electronic device is disposed only on the primary screen. The method includes, if the electronic device uses primary-screen display when the first application is running or when a user interface is displayed, the primary-screen display is locked. In other words, if a screen switching event is received, screen switching is not performed, and the primary-screen display is maintained. In this embodiment, the primary-screen display is locked during running of the first application, and a user may customize a requirement by using such a setting, to implement personalized display settings. Optionally, the primary-screen display may alternatively be replaced with another display manner such as secondary-screen display, large-screen display, or folded dual-screen display. This is not limited in this embodiment of the present disclosure.

Optionally, the first application is a call application. The earpiece is in a working state when the first application is running or when the user interface is displayed.

Alternatively, the first application is a facial recognition application, an infrared sensor used for facial recognition is disposed only on the primary screen, and the infrared sensor is in the working state when the first application is running or when the user interface is displayed.

According to a seventh aspect, an embodiment of the present disclosure provides a display method, applied to an electronic device having a foldable screen. When the foldable screen is in a folded state, the foldable screen is divided into a primary screen and a secondary screen. The method includes that a mobile phone is in a calling state, uses secondary-screen display, and does not respond to a screen-off event reported by a distance sensor located only on the primary screen, or does not generate the screen-off event reported by the distance sensor located only on the primary screen, so as to maintain the secondary-screen display. The distance sensor may alternatively be replaced with a component such as a gravity sensor or a touch sensor that may trigger the screen-off event only in a call scenario. This avoids screen-off of the secondary screen caused by blocking of the primary screen when the secondary-screen displays an incoming call interface, especially when the primary screen is not blocked by a face of a user, for example, when the secondary screen is placed upward on a desk, so that the user can operate the incoming call interface on the secondary screen. This facilitates user operations.

Optionally, for a screen-off event triggered by a physical button and a screen-off event triggered by a periodic automatic screen-off, screen-off processing is still performed, so as to ensure that the user can manually turn off the screen and reduce misoperations of the user.

Optionally, for various screen-off events detected during large-screen display and primary-screen display, screen-off processing is performed for response.

According to an eighth aspect, this application provides an electronic device, including a foldable screen, one or more sensors, one or more processors, one or more memories, and one or more computer programs. When the foldable screen is in a folded state, the foldable screen is divided into a primary screen and a secondary screen. The processor is coupled to the sensor, the foldable screen, and the memory. The one or more computer programs are stored in the memory. When the electronic device runs, the processor executes the one or more computer programs stored in the memory, so that the electronic device performs the display method according to any one of the first to the seventh aspects.

According to a ninth aspect, this application provides a computer storage medium, including computer instructions. When the computer instructions are run on an electronic device, the electronic device is enabled to perform the display method according to any one of the first to the sixth aspects.

According to a tenth aspect, this application provides a computer program product. When the computer program product runs on an electronic device, the electronic device is enabled to perform the display method according to any one of the first to the sixth aspects.

It may be understood that the electronic device in the eighth aspect, the computer storage medium in the ninth aspect, and the computer program product in the tenth aspect that are provided above are all configured to perform the corresponding methods provided above. Therefore, for beneficial effects that can be achieved by the electronic device, the computer storage medium, and the computer program product, refer to beneficial effects in the corresponding methods provided above. Details are not described herein again.

DESCRIPTION OF EMBODIMENTS

The following describes the implementations of the present disclosure in detail with reference to accompanying drawings.

A display method for an electronic device having a foldable screen provided in the embodiments of this application may be applied to an electronic device having a foldable screen such as a mobile phone, a tablet computer, a notebook computer, an ultra-mobile personal computer (UMPC), a handheld computer, a netbook, a personal digital assistant (PDA), a wearable device, or a virtual reality device.

Figure 1:
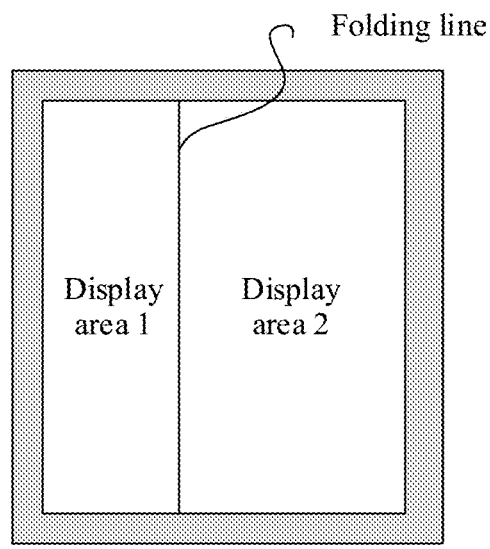
FIG. 1 is a schematic diagram of a structure of an electronic device having a foldable screen in the conventional technology.

In the embodiments of the present disclosure, the foldable screen of the electronic device may perform display as a complete display area in an unfolded state, and a user may fold the screen along one or more folding lines on the foldable screen. A position of the folding line may be preset, or may be randomly selected by the user on the foldable screen. After the user folds the screen along the folding line on the foldable screen, the foldable screen may be divided into two display areas along the folding line, similar to a display area of a left screen (or a secondary screen) and a display area of a right screen (or a primary screen) shown in FIG. 1. It should be noted that the primary screen and the secondary screen may be a same screen physically, or may be two screens. This is not limited in the present disclosure. In the embodiments of the present disclosure, division of the primary screen and the secondary screen is only for ease of description, and there is no limitation on primary use or secondary use.

Figure 2A:
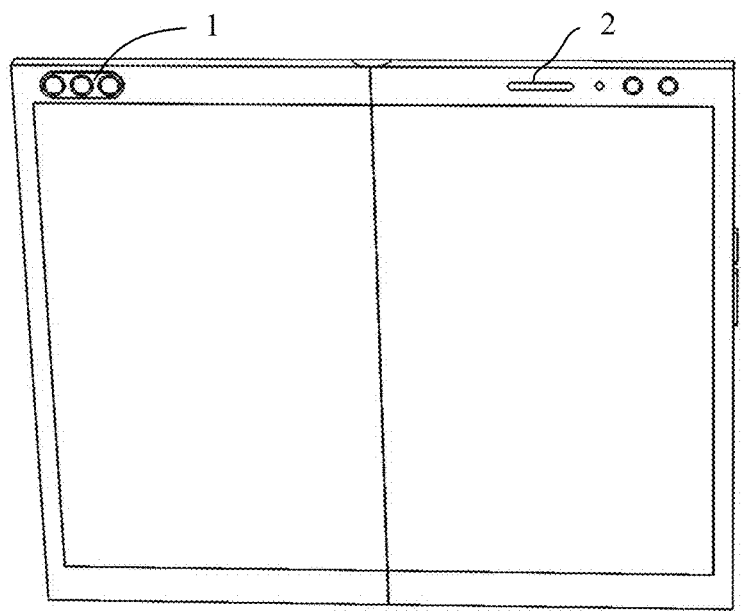
FIG. 2A is a schematic diagram of an electronic device in an unfolded state according to an embodiment of this application.
Figure 2B:
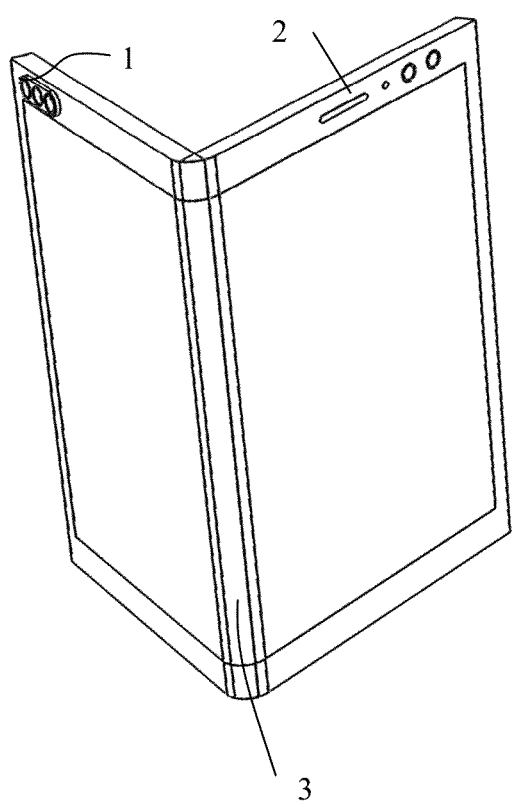
FIG. 2B is a schematic diagram of an electronic device in a folded state according to an embodiment of this application.

Some components of the electronic device are located on only one of the primary screen and the secondary screen. FIG. 2A is an unfolded state of a mobile phone with a foldable screen. FIG. 2B is a folded state of a mobile phone with a foldable screen. As shown in FIG. 2A and FIG. 2B, a camera 1 is disposed above the left screen, an earpiece 2 is disposed above the right screen, some components such as an infrared sensor and a distance sensor are further disposed on the right side of the earpiece 2, and a microphone is disposed below the right screen (not shown in the figure). In some implementations, the screen of the electronic device is divided into only the primary screen and the secondary screen. In some other implementations, when the mobile phone is in the folded state, in addition to the primary screen and the secondary screen, the electronic device further includes a side screen 3. After the user folds a flexible display 301 along the folding line, the primary screen and the secondary screen may be facing each other, or the primary screen and the secondary screen may be away from each other.

The following uses the mobile phone as an example.

Figure 3:
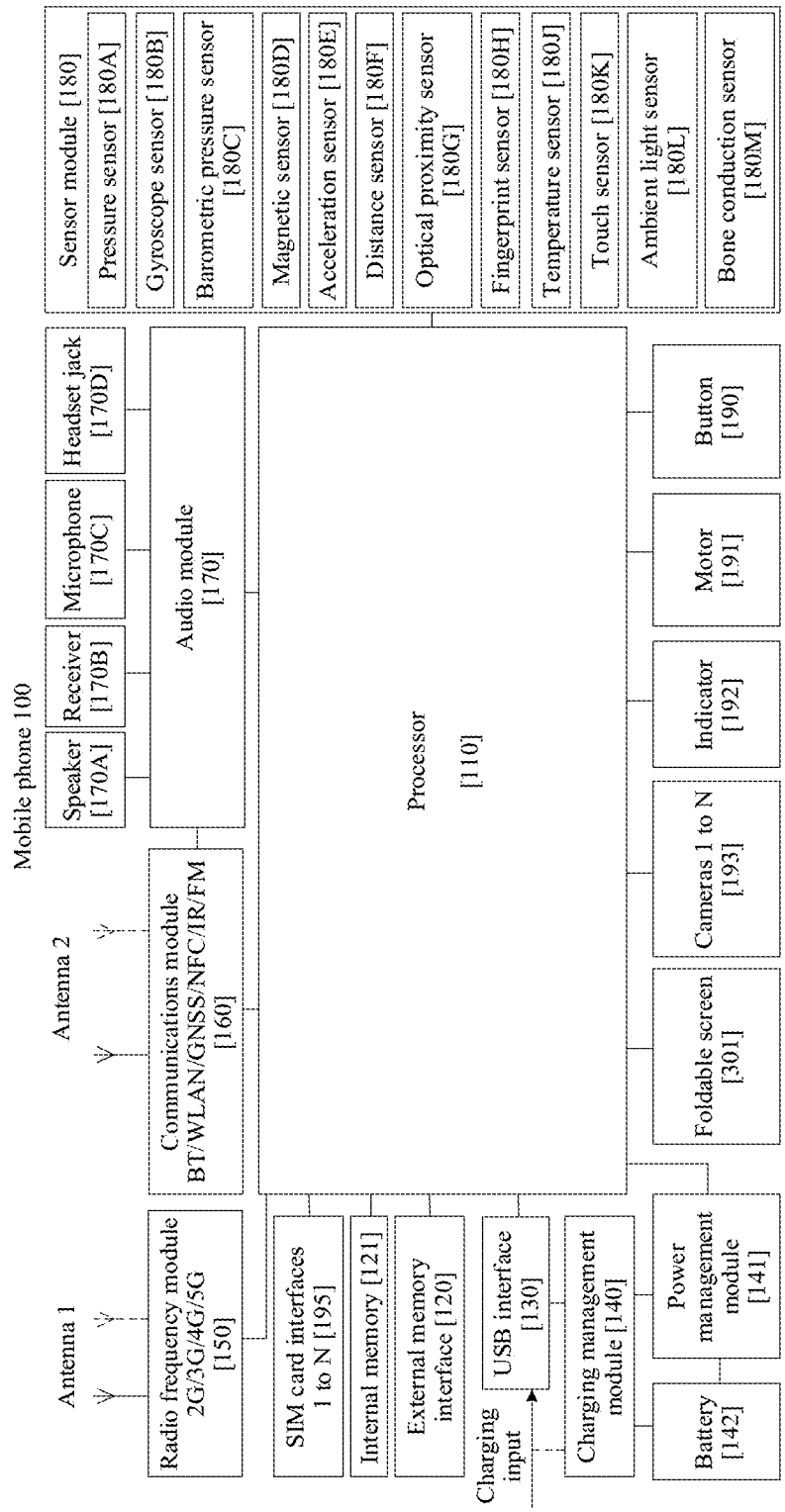
FIG. 3 is a schematic diagram of a structure of an electronic device according to an embodiment of this application.

FIG. 3 is a schematic diagram of a structure of a mobile phone.

The mobile phone 100 may include a processor 110, an external memory interface 120, an internal memory 121, a Universal Serial Bus (USB) interface 130, a charging management module 140, a power management module 141, a battery 142, an antenna 1, an antenna 2, a radio frequency module 150, a communications module 160, an audio module 170, a speaker 170A, a receiver 170B, a microphone 170C, a headset jack 170D, a sensor module 180, a button 190, a motor 191, an indicator 192, a camera 193, a foldable screen 301, a subscriber identification module (SIM) card interface 195, and the like.

It may be understood that the illustrated structure in this embodiment of this application does not constitute a specific limitation on the mobile phone 100. In some other embodiments of this application, the mobile phone 100 may include more or fewer components than those shown in the figure, or combine some components, or divide some components, or have different component arrangements. The components shown in the figure may be implemented by hardware, software, or a combination of software and hardware.

The processor 110 may include one or more processing units. For example, the processor 110 may include an application processor (AP), a modem processor, a graphics processing unit (GPU), an image signal processor (ISP), a controller, a memory, a video codec, a digital signal processor (DSP), a baseband processor, a neural-network processing unit (NPU), and/or the like. Different processing units may be independent components, or may be integrated into one or more processors.

The controller may be a nerve center and a command center of the mobile phone 100. The controller may generate an operation control signal based on instruction operation code and a time sequence signal, to complete control of instruction reading and instruction execution.

A memory may be further disposed in the processor 110, and is configured to store instructions and data. In some embodiments, the memory in the processor 110 is a cache. The memory may store instructions or data just used or cyclically used by the processor 110. If the processor 110 needs to use the instructions or the data again, the processor may directly invoke the instructions or the data from the memory. This avoids repeated access, reduces waiting time of the processor 110, thereby improving system efficiency.

In some embodiments, the processor 110 may include one or more interfaces. The interface may include an Inter-Integrated Circuit (I2C) interface, an I2C Sound (I2S) interface, a pulse code modulation (PCM) interface, a universal asynchronous receiver/transmitter (UART) interface, a Mobile Industry Processor Interface (MIPI), a general-purpose input/output (GPIO) interface, a SIM interface, a USB interface, and/or the like.

The I2C interface is a two-way synchronization serial bus, and includes a serial data line (SDA) and a serial clock line (SCL) (or derail clock line). In some embodiments, the processor 110 may include a plurality of groups of I2C buses. The processor 110 may be separately coupled to the touch sensor 180K, a charger, a flashlight, the camera 193, and the like through different I2C bus interfaces. For example, the processor 110 may be coupled to the touch sensor 180K through the I2C interface, so that the processor 110 communicates with the touch sensor 180K through the I2C bus interface, to implement a touch function of the mobile phone 100.

The I2S interface may be configured to perform audio communication. In some embodiments, the processor 110 may include a plurality of groups of I2S buses. The processor 110 may be coupled to the audio module 170 through the I2S bus, to implement communication between the processor 110 and the audio module 170. In some embodiments, the audio module 170 may transmit an audio signal to the communications module 160 through the I2S interface, to implement a function of answering a call by using a BLUETOOTH headset.

The PCM interface may also be configured to perform audio communication, and sample, quantize, and code an analog signal. In some embodiments, the audio module 170 may be coupled to the communications module 160 through a PCM bus interface. In some embodiments, the audio module 170 may also transmit an audio signal to the communications module 160 through the PCM interface, to implement a function of answering a call by using a BLUETOOTH headset. Both the I2S interface and the PCM interface may be used to perform audio communication.

The UART interface is a universal serial data bus, and is configured to perform asynchronous communication. The bus may be a two-way communications bus. The bus converts to-be-transmitted data between serial communication and parallel communication. In some embodiments, the UART interface is usually configured to connect the processor 110 and the communications module 160. For example, the processor 110 communicates with a BLUETOOTH module in the communications module 160 through the UART interface, to implement a BLUETOOTH function. In some embodiments, the audio module 170 may transmit an audio signal to the communications module 160 through the UART interface, to implement a function of playing music by using a BLUETOOTH headset.

The MIPI interface may be configured to connect the processor 110 to a peripheral component such as the foldable screen 301 or the camera 193. The MIPI interface includes a camera serial interface (CSI), a display serial interface (DSI), and the like. In some embodiments, the processor 110 communicates with the camera 193 through the CSI interface, to implement a photographing function of the mobile phone 100. The processor 110 communicates with the foldable screen 301 through the DSI interface, to implement a display function of the mobile phone 100.

The GPIO interface may be configured through software. The GPIO interface may be configured as a control signal or a data signal. In some embodiments, the GPIO interface may be configured to connect the processor 110 and the camera 193, the foldable screen 301, the communications module 160, the audio module 170, the sensor module 180, or the like. The GPIO interface may alternatively be configured as an I2C interface, an I2S interface, a UART interface, an MIPI interface, or the like.

The USB interface 130 is an interface that conforms to a USB standard specification, and may be a mini USB interface, a micro USB interface, a USB Type-C interface, or the like. The USB interface 130 may be configured to connect to the charger to charge the mobile phone 100, or may be configured to transmit data between the mobile phone 100 and a peripheral device, or may be configured to connect to a headset to play audio by using the headset. Alternatively, the interface may be configured to connect to another electronic device, for example, an augmented reality (AR) device.

It may be understood that an interface connection relationship between the modules shown in this embodiment of this application is merely an example for description, and does not constitute a limitation on the structure of the mobile phone 100. In some other embodiments of this application, the mobile phone 100 may alternatively use an interface connection manner different from that in the foregoing embodiment, or use a combination of a plurality of interface connection manners.

The charging management module 140 is configured to receive a charging input from the charger. The charger may be a wireless charger or a wired charger. In some embodiments of wired charging, the charging management module 140 may receive a charging input from the wired charger through the USB interface 130. In some embodiments of wireless charging, the charging management module 140 may receive a wireless charging input by using a wireless charging coil of the mobile phone 100. The charging management module 140 may further supply power to the electronic device by using the power management module 141 while charging the battery 142.

The power management module 141 is configured to connect to the battery 142, the charging management module 140, and the processor 110. The power management module 141 receives an input of the battery 142 and/or the charging management module 140, and supplies power to the processor 110, the internal memory 121, an external memory, the foldable screen 301, the camera 193, the communications module 160, and the like. The power management module 141 may be further configured to monitor parameters such as a battery capacity, a battery cycle count, and a battery health status (electric leakage or impedance). In some other embodiments, the power management module 141 may alternatively be disposed in the processor 110. In some other embodiments, the power management module 141 and the charging management module 140 may alternatively be disposed in a same device.

A wireless communication function of the mobile phone 100 may be implemented by using the antenna 1, the antenna 2, the radio frequency module 150, the communications module 160, the modem processor, the baseband processor, and the like.

The antenna 1 and the antenna 2 are configured to transmit and receive electromagnetic wave signals. Each antenna in the mobile phone 100 may be configured to cover one or more communication bands. Different antennas may be multiplexed to improve antenna utilization. For example, the antenna 1 may be multiplexed as a diversity antenna in a wireless local area network. In some other embodiments, the antenna may be used in combination with a tuning switch.

The radio frequency module 150 may provide a wireless communication solution that is applied to the mobile phone 100 and that includes second generation (2G)/third generation (3G)/fourth generation (4G)/fifth generation (5G). The radio frequency module 150 may include at least one filter, a switch, a power amplifier, a low noise amplifier (LNA), and the like. The radio frequency module 150 may receive an electromagnetic wave by using the antenna 1, perform processing such as filtering or amplification on the received electromagnetic wave, and transfer the electromagnetic wave to the modem processor for demodulation. The radio frequency module 150 may further amplify a signal modulated by the modem processor, and convert the signal into an electromagnetic wave for radiation by using the antenna 1. In some embodiments, at least some function modules in the radio frequency module 150 may be disposed in the processor 110. In some embodiments, at least some function modules in the radio frequency module 150 may be disposed in a same component as at least some modules in the processor 110.

The modem processor may include a modulator and a demodulator. The modulator is configured to modulate a to-be-sent low-frequency baseband signal into a medium-high-frequency signal. The demodulator is configured to demodulate a received electromagnetic wave signal into a low-frequency baseband signal. Then, the demodulator transmits the low-frequency baseband signal obtained through demodulation to the baseband processor for processing. The low-frequency baseband signal is processed by the baseband processor, and then transmitted to the application processor. The application processor outputs a sound signal by using an audio device (which is not limited to the speaker 170A, the receiver 170B, or the like), or displays an image or a video through the foldable screen 301. In some embodiments, the modem processor may be an independent component. In some other embodiments, the modem processor may be independent of the processor 110, and is disposed in a same component as the radio frequency module 150 or another function module.

The communications module 160 may provide a wireless communication solution that is applied to the mobile phone 100 and that include a wireless local area network (WLAN) (for example, a WI-FI network), BLUETOOTH (BT), a global navigation satellite system (GNSS), frequency modulation (FM), a near-field communication (NFC) technology, or an infrared (IR) technology. The communications module 160 may be one or more components integrating at least one communications processor module. The communications module 160 receives an electromagnetic wave by using the antenna 2, performs frequency modulation and filtering processing on an electromagnetic wave signal, and sends a processed signal to the processor 110. The communications module 160 may further receive a to-be-sent signal from the processor 110, perform frequency modulation and amplification on the signal, and convert the signal into an electromagnetic wave for radiation by using the antenna 2.

In some embodiments, the antenna 1 of the mobile phone 100 is coupled to the radio frequency module 150, and the antenna 2 is coupled to the communications module 160, so that the mobile phone 100 can communicate with a network and another device by using a wireless communications technology. The wireless communications technology may include a Global System for Mobile Communications (GSM), a General Packet Radio Service (GPRS), code-division multiple access (CDMA), wideband CDMA (WCDMA), time-division synchronous CDMA (TD-SCDMA), Long-Term Evolution (LTE), BT, a GNSS, a WLAN, NFC, FM, an IR technology, and/or the like. The GNSS may include a Global Positioning System (GPS), a global navigation satellite system (GLONASS), a BEIDOU navigation satellite system (BDS), a quasi-zenith satellite system (QZSS), and/or a satellite based augmentation system (SBAS).

The mobile phone 100 implements a display function by using the GPU, the foldable screen 301, the application processor, and the like. The GPU is a microprocessor for image processing, and is connected to the foldable screen 301 and the application processor. The GPU is configured to perform mathematical and geometric calculation, and render an image. The processor 110 may include one or more GPUs that execute program instructions to generate or change display information. In this embodiment of this application, the foldable screen 301 may include a display and a touch panel. The display is configured to output display content to a user, and the touch panel is configured to receive a touch event input by the user on the foldable screen 301.

The foldable screen 301 may perform display as a complete display area in an unfolded state. After the user folds the foldable screen 301 along a folding line in the foldable screen 301, a primary screen and a secondary screen into which the foldable screen 301 is divided along the folding line may perform display as two independent display areas.

In some embodiments, after the user folds the foldable screen 301, a screen of a bent part (which may also be referred to as a side screen) may also be used as an independent display area, for example, the side screen 3 in FIG. 2B. In this case, the foldable screen 301 is divided into three independent display areas: the primary screen, the secondary screen, and the side screen. Display of the side screen may be separately controlled, or the side screen performs display together with the primary screen, or the side screen performs display together with the secondary screen. This is not limited in the present disclosure.

It should be understood that the folding line in this embodiment of this application is merely used for ease of understanding, and the folding line may also be a folding belt, a boundary line, a boundary belt, or the like.

The sensor module 180 may include one or more of a gyroscope, an acceleration sensor (for example, a gravity sensor), a pressure sensor, a magnetic sensor (for example, a Hall effect sensor), a distance sensor, an optical proximity sensor, a fingerprint sensor, a temperature sensor, a touch sensor, an infrared sensor, an ambient light sensor, or a bone conduction sensor. This is not limited in this embodiment of this application.

The mobile phone 100 may implement a photographing function by using the ISP, the camera 193, the video codec, the GPU, the foldable screen 301, the application processor, and the like.

The ISP is configured to process data fed back by the camera 193. For example, during photographing, a shutter is pressed, and light is transmitted to a photosensitive element of the camera through a lens. An optical signal is converted into an electrical signal, and the photosensitive element of the camera transmits the electrical signal to the ISP for processing, to convert the electrical signal into a visible image. The ISP may further perform algorithm optimization on noise, brightness, and complexion of the image. The ISP may further optimize parameters such as exposure and a color temperature of a photographing scenario. In some embodiments, the ISP may be disposed in the camera 193.

The camera 193 is configured to capture a static image or a video. An optical image of an object is generated through the lens, and is projected onto the photosensitive element. The photosensitive element may be a charge coupled device (CCD) or a complementary metal-oxide-semiconductor (CMOS) photoelectric transistor. The photosensitive element converts an optical signal into an electrical signal, and then transmits the electrical signal to the ISP for converting the electrical signal into a digital image signal. The ISP outputs the digital image signal to the DSP for processing. The DSP converts the digital image signal into an image signal in a standard format such as red, green, and blue (RGB) or luma, blue projection, and red projection (YUV). In some embodiments, the mobile phone 100 may include one or N cameras 193, where N is a positive integer greater than 1.

The digital signal processor is configured to process a digital signal, and may process another digital signal in addition to the digital image signal. The video codec is configured to compress or decompress a digital video. The mobile phone 100 may support one or more video codecs. In this way, the mobile phone 100 can play or record videos in a plurality of coding formats, for example, Moving Picture Experts Group (MPEG)-1, MPEG-2, MPEG-3, and MPEG-4.

The NPU is a neural-network (NN) computing processor, quickly processes input information by referring to a structure of a biological neural network, for example, by referring to a mode of transmission between human brain neurons, and may further continuously perform self-learning. Applications such as intelligent cognition of the mobile phone 100, such as image recognition, facial recognition, voice recognition, and text understanding, can be implemented by using the NPU.

The external memory interface 120 may be configured to connect to an external storage card such as a micro Secure Digital (SD) card, to extend a storage capability of the mobile phone 100. The external memory card communicates with the processor 110 through the external memory interface 120, to implement a data storage function. For example, files such as music and a video are stored in the external storage card.

The internal memory 121 may be configured to store computer-executable program code. The executable program code includes instructions. The processor 110 runs the instructions stored in the internal memory 121, to implement various function applications and data processing of the mobile phone 100. The internal memory 121 may include a program storage area and a data storage area. The program storage area may store an operating system, an application required by at least one function (for example, a voice playing function, an image playing function, a camera function, or a call function), and the like. The data storage area may store data (for example, audio data or image data) created during use of the mobile phone 100, and the like. In addition, the internal memory 121 may include a high-speed random-access memory (RAM), and may further include a nonvolatile memory, for example, at least one magnetic disk storage device, a flash memory device, or a Universal Flash Storage (UFS).

The mobile phone 100 may implement an audio function such as music playing or recording by using the audio module 170, the speaker 170A, the receiver 170B, the microphone 170C, the headset jack 170D, the application processor, and the like.

The audio module 170 is configured to convert digital audio information into an analog audio signal output, and is also configured to convert an analog audio input into a digital audio signal. The audio module 170 may be further configured to code and decode an audio signal. In some embodiments, the audio module 170 may be disposed in the processor 110, or some function modules of the audio module 170 are disposed in the processor 110.

The speaker 170A, also referred to as a "loudspeaker", is configured to convert an audio electrical signal into a sound signal. The mobile phone 100 may listen to music or answer a hands-free call through the speaker 170A.

The receiver 170B, also referred to as an "earpiece", is configured to convert an audio electrical signal into a sound signal. When a call is answered or voice information is received by using the mobile phone 100, the receiver 170B may be put close to a human ear to listen to a voice.

The microphone 170C, also referred to as a mike or a mic, is configured to convert a sound signal into an electrical signal. When making a call or sending voice information, the user may make a sound by moving a human mouth close to the microphone 170C to input a sound signal to the microphone 170C. At least one microphone 170C may be disposed in the mobile phone 100. In some other embodiments, two microphones 170C may be disposed in the mobile phone 100, to collect a sound signal and further implement a noise reduction function. In some other embodiments, three, four, or more microphones 170C may alternatively be disposed in the mobile phone 100, to collect a sound signal, reduce noise, further identify a sound source, implement a directional recording function, and the like.

The headset jack 170D is configured to connect to a wired headset. The headset jack 170D may be a USB interface 130, or may be a 3.5 millimeters (mm) Open Mobile Terminal Platform (OMTP) standard interface or cellular telecommunications industry association of the United States of America (USA) (CTIA) standard interface.

The button 190 includes a power button, a volume button, and the like. The button 190 may be a mechanical button, or may be a touch button. The mobile phone 100 may receive key input, and generate a key signal input related to a user setting and function control of the mobile phone 100.

The motor 191 may generate a vibration prompt. The motor 191 may be configured to produce an incoming call vibration prompt and a touch vibration feedback. For example, touch operations performed on different applications (for example, photographing and audio playing) may correspond to different vibration feedback effects. The motor 191 may also correspond to different vibration feedback effects for touch operations performed on different areas of the foldable screen 301. Different application scenarios (for example, a time reminder scenario, an information receiving scenario, an alarm clock scenario, and a game scenario) may also correspond to different vibration feedback effects. A touch vibration feedback effect may be further customized.

The indicator 192 may be an indicator light, and may be configured to indicate a charging status and a power change, or may be configured to indicate a message, a missed call, a notification, and the like.

The SIM card interface 195 is configured to connect to a SIM card. The SIM card may be inserted into the SIM card interface 195 or plugged from the SIM card interface 195, to implement contact with or separation from the mobile phone 100. The mobile phone 100 may support one or N SIM card interfaces, where N is a positive integer greater than 1. The SIM card interface 195 may support a nano-SIM card, a micro-SIM card, a SIM card, and the like. A plurality of cards may be simultaneously inserted into a same SIM card interface 195. The plurality of cards may be of a same type or of different types. The SIM card interface 195 may also be compatible with different types of SIM cards. The SIM card interface 195 may also be compatible with an external storage card. The mobile phone 100 interacts with a network by using the SIM card, to implement functions such as calling and data communication. In some embodiments, the mobile phone 100 uses an eSIM, namely, an embedded SIM card. The eSIM card may be embedded in the mobile phone 100, and cannot be separated from the mobile phone 100.

A software system of the mobile phone 100 may use a layered architecture, an event-driven architecture, a microkernel architecture, a microservice architecture, or a cloud architecture. In this embodiment of this application, an Android system with a layered architecture is used as an example to describe the software structure of the mobile phone 100.

Figure 4:
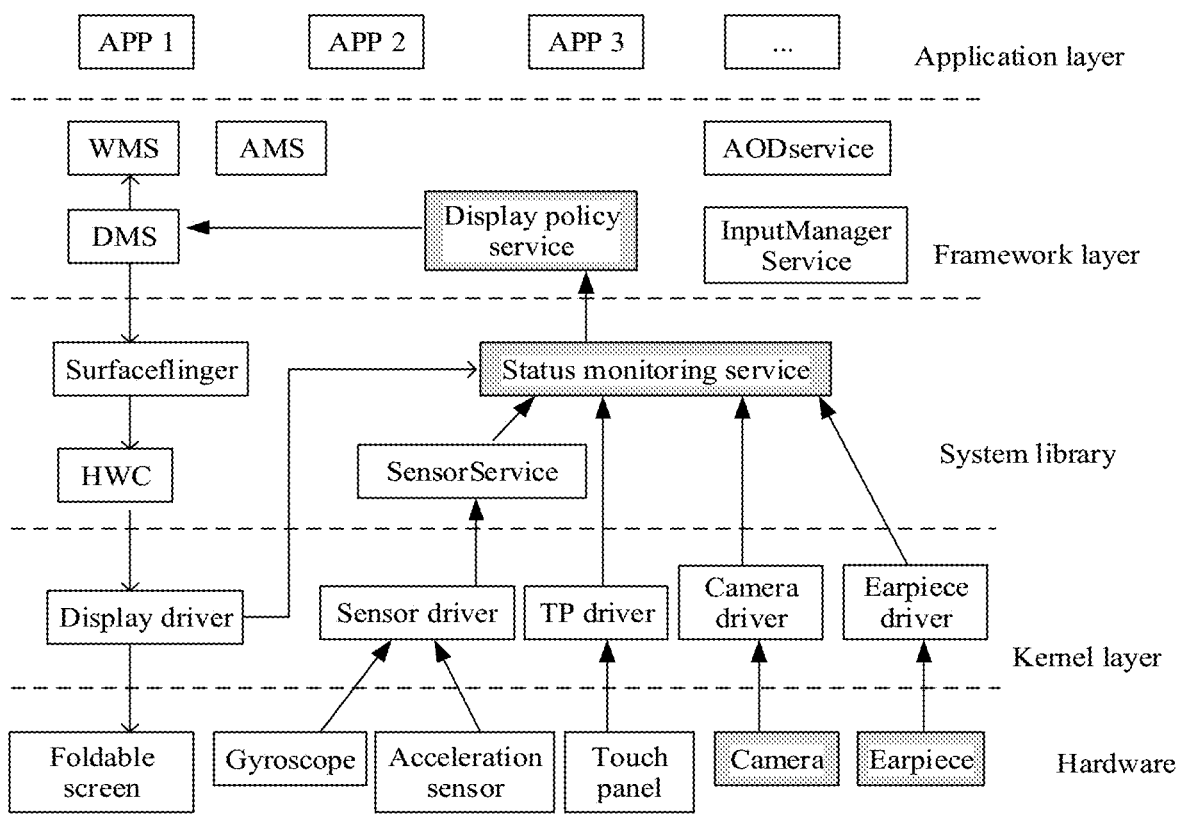
FIG. 4 is a schematic diagram of another structure of an electronic device according to an embodiment of this application.

FIG. 4 is a schematic diagram of another structure of a mobile phone according to an embodiment of this application. In the figure, four software layers are included, including an application layer, an application framework layer (framework layer), a system library, and a kernel layer from top to bottom. Below the kernel layer is hardware.

The application layer may include a series of applications such as camera (or photographing), gallery, calendar, phone, map, navigation, BLUETOOTH, music, video, messages, phone, WECHAT, and social security.

The framework layer provides an application programming interface (API) and a programming framework for an application at the application layer. The framework layer includes some predefined functions. The framework layer may include a display policy service, a power manager service (PMS), and a display manager service (DMS). Certainly, the framework layer may further include an activity manager, a window manager, a content provider, a view system, a phone manager, a resource manager, a notification manager, and the like. This is not shown in the figure, and this is not limited in this embodiment of this application.

The display policy service may obtain, from an underlying display system, a specific physical form of a current foldable screen, a holding gesture of a user, a status of a camera, a status of an earpiece, and the like, to determine primary-screen display, secondary-screen display, large-screen display (that is, the foldable screen is unfolded, and both a primary screen and a secondary screen perform display), or folded dual-screen display (that is, the foldable screen is folded, and both the primary screen and the secondary screen perform display). In the primary-screen display, the secondary screen is in a black-screen state or an off-screen state. In the secondary-screen display, the primary screen is in the black-screen state or the off-screen state. In the large-screen display, an entire foldable screen performs display as a complete display screen. A status of the screen is subsequently described in detail with reference to Table 1.

Still refer to FIG. 4. The system library, the kernel layer, and the like below the application framework layer may be referred to as an underlying system. The underlying system includes the underlying display system configured to provide a display service. For example, the underlying display system includes a display driver at the kernel layer, a surface manager in the system library, and the like.

The underlying system in this application further includes a status monitoring service configured to identify a change in a physical form of the foldable screen. The status monitoring service may be independently disposed in the underlying display system, or may be disposed in the system library and/or at the kernel layer.

For example, the status monitoring service may invoke a sensor service to start a sensor such as a gyroscope, an acceleration sensor, and a Hall device to perform detection. The status monitoring service may calculate a current included angle between the primary screen and the secondary screen based on detection data reported by each sensor.

In this way, based on the included angle between the primary screen and the secondary screen, the status monitoring service may determine that the foldable screen is in a physical form such as an unfolded state or a folded state. In addition, the status monitoring service may report the determined physical form to the display policy service.

The status monitoring service may further obtain a call-related event (such as an incoming call event or a call end event) from the phone manager, and report the event to the display policy service. The status monitoring service may further obtain, by using the activity manager, the window manager, and/or the like, information such as an identifier of a running application or an identifier of an application displayed in the foreground, and report the information to the display policy service.

The status monitoring service may receive data detected by a touch panel by using a touch panel (TP) driver, data detected by the camera by using a camera driver, and data detected by the earpiece by using an earpiece driver, to respectively determine a touch event, a working status of the camera, and a working status of the earpiece.

The status monitoring service may further determine a specific orientation of the mobile phone based on data reported by the touch panel, the camera, or an infrared sensor (not shown in the figure).

The status monitoring service may report, to the display policy service, the determined information such as the specific orientation of the mobile phone, the physical form of the foldable screen, the touch event, the working status of the component such as the camera or the earpiece, and the identifier of the running application or the application being displayed, and the display policy service determines a screen that currently needs to be lit up for display. The display policy service may notify the DMS of a determined display mode. For example, the display mode is a large-screen display mode. The DMS may power on the entire foldable screen by using a surfaceflinger and the display driver, and the DMS may notify a window management service (WMS) to create a corresponding window on the foldable screen for display.

The application layer and the application framework layer run on a virtual machine. The virtual machine executes Java files at the application layer and the application framework layer as binary files. The virtual machine is configured to implement functions such as object lifecycle management, stack management, thread management, security and exception management, and garbage collection.

The system library may include a plurality of function modules, for example, a surface manager, a media library, a three-dimensional (3D) graphics processing library (for example, OpenGL for Embedded Systems (ES)), and a two-dimensional (2D) graphics engine (for example, SGL). The surface manager is configured to manage a display subsystem and provide fusion of 2D and 3D layers for a plurality of applications. The media library supports playback and recording of audio and video in a plurality of commonly used formats, static image files, and the like. The media library may support a plurality of audio and video coding formats, for example, MPEG-4, H.264, MPEG-1 Audio Layer III or MPEG-2 Audio Layer III (MP3), Advanced Audio Coding (AAC), Adaptive Multi-Rate (AMR), Joint Photographic Experts Group (JPEG), and Portable Network Graphics (PNG). The three-dimensional graphics processing library is configured to implement three-dimensional graphics drawing, image rendering, composition, layer processing, and the like. The 2D graphics engine is a drawing engine for 2D drawing.

The kernel layer is a layer between the hardware and the system library. The kernel layer includes at least the display driver, the camera driver, an audio driver, a sensor driver, the TP driver, the earpiece driver, and the like. This is not limited in this embodiment of this application.

The hardware includes the foldable screen, the gyroscope, the acceleration sensor, the touch panel (which may be integrated into the foldable screen), the camera, and the earpiece shown in FIG. 4, and may further include the infrared sensor, a distance sensor, an optical proximity sensor, and the like that are not shown in the figure.

The following uses an example to describe a manner of performing display control by the display policy service in this embodiment of the present disclosure.

The status of the screen in this embodiment of the present disclosure is first described. The status of the screen includes two types a screen-off state and a screen-on state. The screen-on state further includes large-screen display, primary-screen display, secondary-screen display, and folded dual-screen display. Further:

TABLE 1

|  |  | Primary screen | Secondary screen | Whether being folded |
|---|---|---|---|---|
| Screen-off |  | Black screen | Black screen | Folded or unfolded |
| Screen-on | Large-screen display | Screen-on (display) | Screen-on (display) | Unfolded |
|  | Primary-screen display | Screen-on (display) | Black screen | Folded |
|  | Secondary-screen display | Black screen | Screen-on (display) | Folded |
|  | Folded dual-screen display (or collaborative display) | Screen-on (display) | Screen-on (display) | Folded |

As described above, the status of the screen is determined by the status monitoring service and then provided to the display policy service. The display policy service determines the screen that currently needs to be lit up for display. The display policy service may use different display control manners for different scenarios.

In this embodiment of the present disclosure, the earpiece and the microphone are disposed on the primary screen (for example, may be disposed below the primary screen in FIG. 2A and FIG. 2B, which is not shown in the figure), but no camera is disposed. The earpiece and the microphone are not disposed on the secondary screen, but the camera is disposed.

In some embodiments, when the mobile phone receives an incoming call and is not connected to a headset, for ease of holding, the user often folds the mobile phone and then put the mobile phone close to the ear to answer the call. Because the earpiece and the microphone are disposed only on the primary screen, putting the primary screen close to the ear provides better call quality than putting the secondary screen close to the ear. During the call, if the mobile phone performs the secondary-screen display, and if the user wants to operate a user interface (an "interface" for short) of the mobile phone, the secondary screen needs to be facing the user. Therefore, in a call scenario, in order to meet requirements of the call and a user operation interface, the display control manner can be set as allowing the primary-screen display, the large-screen display, or the folded dual-screen display but not the secondary-screen display during the call. This display control manner that does not allow the secondary-screen display is referred to as a display control manner 1, or a limited display control manner.

In addition, during the call, the user may need to turn on the camera, and if the user wants to perform front-facing photographing when using the camera, the secondary screen needs to be facing the user. In this case, if the primary-screen display is still used, the user cannot preview a photographing interface and operation in a selfie process. Therefore, the display control manner may be set as follows. If the camera is started during the call, the primary-screen display may be switched to the secondary-screen display, the large-screen display, or the folded dual-screen display, that is, the secondary-screen display is allowed. This display control manner that allows the secondary-screen display is referred to as a display control manner 2.

In some embodiments, when the foldable screen of the mobile phone is in the black screen (or off-screen) state, the mobile phone may receive a triggering operation used to wake up the display screen. For example, the triggering operation may be an operation of tapping a power button, a hand lifting operation, a double-tap operation, a floating touch operation, a fingerprint unlock operation, or an operation of plugging or unplugging a USB data line of the user. After receiving the triggering operation, the underlying system of the mobile phone may report a screen-on event to the power manager service. Further, the power manager service may obtain, from the display policy service, a specific screen that currently needs to be woken up. For example, when the foldable screen is in the unfolded state, regardless of whether the camera and the earpiece are currently enabled, the display policy service may determine that the screen that needs to be lit up at this time is a large screen formed by the primary screen and the secondary screen (that is, the large-screen display). Further, the display policy service may notify the power manager service to light up the large screen. In this way, the power manager service may use the display manager service to wake up the large screen formed by the primary screen and the secondary screen, and the large screen performs display.

In some other embodiments, when the foldable screen of the mobile phone is in the black screen (or off-screen) state, after receiving the triggering operation, the underlying system of the mobile phone may report the screen-on event to the power manager service. When the foldable screen is in the folded state, and the earpiece is turned on and the camera is turned off, the display policy service may determine that the screen that needs to be lit up at this time is the primary screen instead of the secondary screen. In this way, the power manager service may use the display manager service to wake up the primary screen for display.

In some embodiments, when the status monitoring service determines that the mobile phone is currently in the folded state, the status monitoring service may further enable the sensor such as the camera, the infrared sensor, the optical proximity sensor, or the TP to identify the specific orientation of the mobile phone. For example, the specific orientation of the mobile phone may include that the primary screen is facing the user, the secondary screen is facing the user, or the like. For example, when the mobile phone is in the folded state and the primary screen is facing the user, the display policy service may determine the primary screen as the screen that needs to be lit up. When the mobile phone is in the folded state and the secondary screen is facing the user, the display policy service may determine the secondary screen as the screen that needs to be lit up.

It should be understood that, in this embodiment of this application, that the primary screen, the secondary screen, or the entire foldable screen is facing the user includes The primary screen, the secondary screen, or the entire foldable screen is facing the user at an angle that is substantially parallel to a face of the user. It also includes the primary screen, the secondary screen or the entire foldable screen is facing the user at a specific tilt angle. In addition, that the primary screen, the secondary screen, or the entire foldable screen in this embodiment of this application faces upward includes that the primary screen, the secondary screen, or the entire foldable screen faces upward at a horizontal angle. Alternatively, the primary screen, the secondary screen, or the entire foldable screen faces upward at a specific angle to a horizontal plane.

It can be learned that, when the display screen of the mobile phone is a foldable screen, if an event of possible screen switching is detected, the mobile phone lights up a corresponding screen for display based on not only the current physical form of the foldable screen, but also a working status of some components (for example, the camera or the earpiece) or an application. In this way, the foldable screen can provide relatively good use experience for the user in different use scenarios, thereby avoiding inconvenient user operations.

The following provides descriptions with reference to some specific scenarios.

(1) A wake-up event is detected when the screen is off.

Figure 11:
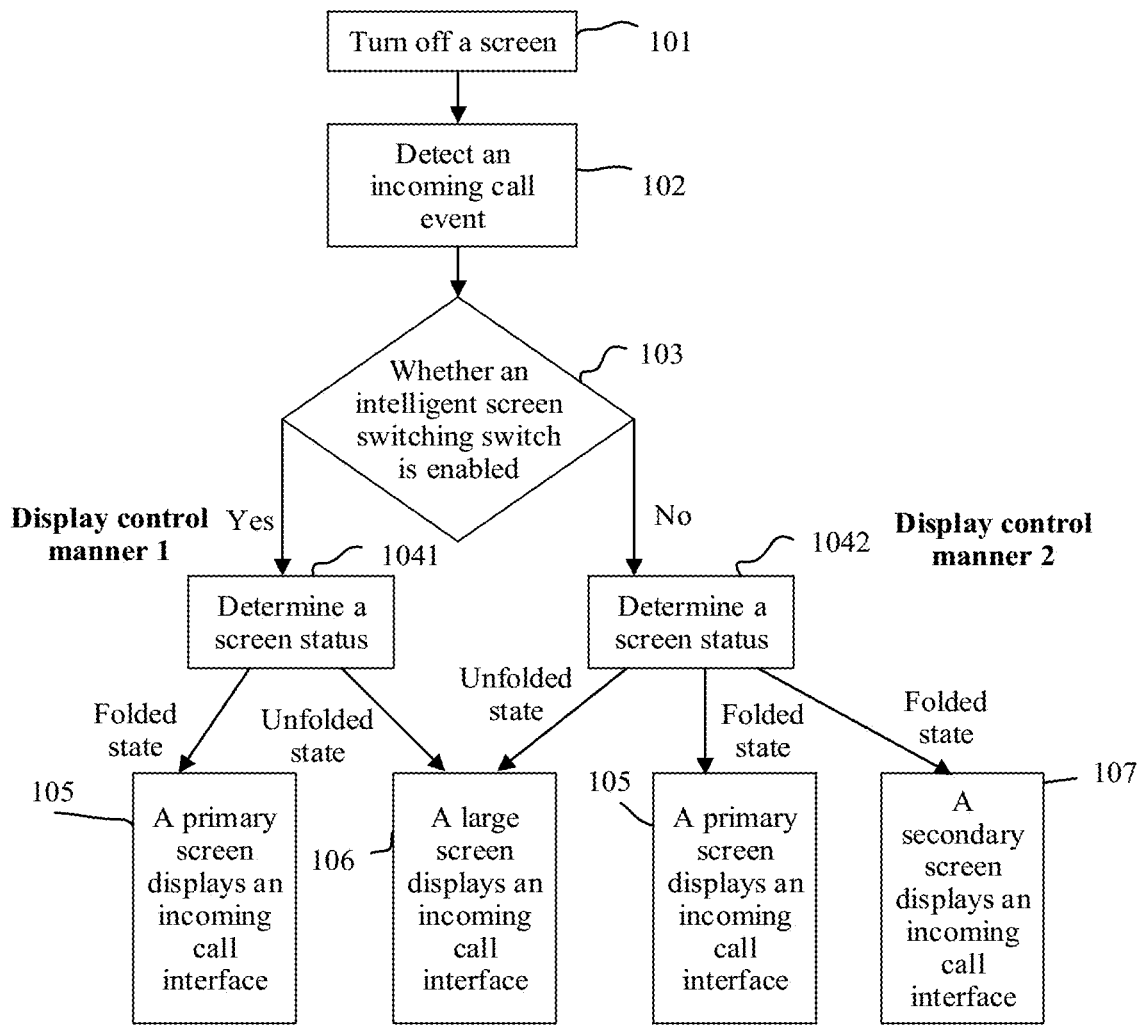
FIG. 11 is a processing flowchart of an electronic device according to an embodiment of this application.

In some embodiments, a processing procedure shown in FIG. 11 may be used in response to detecting the incoming call event in the screen-off state. When the mobile phone is in the screen-on state, the mobile phone detects a screen-off operation of the user, for example, the operation of tapping the power button. In response to the screen-off operation, the mobile phone performs step 101 in FIG. 11 to turn off the screen. If the mobile phone detects the incoming call event in the screen-off state (for example, step 102), the mobile phone determines whether an intelligent screen switching switch is currently enabled (for example, step 103). For obtaining of the incoming call event, refer to the foregoing related description of the status monitoring service. This is not repeated herein.

It should be noted that the intelligent screen switching switch in this embodiment is a function of automatically controlling a screen display manner of the mobile phone. The user may trigger a screen switching event by using an explicit operation such as a control on the user interface, a physical button, a screen-on gesture, or a screen-off gesture. For example, the user taps a screen switching button, the user taps the power button to turn on or off the screen, or the user double-taps the screen to turn on or off the screen. Different from this, intelligent screen switching provides a more intelligent screen switching manner. For example, the status of the screen may be controlled only based on an orientation of the screen, or only based on an angle of the screen, or only based on a holding posture, or based on any two or three of the foregoing conditions. The user can trigger the screen switching event by changing the preceding conditions. It may be understood that, compared with a manner of triggering by using the explicit operation by the user, such intelligent screen switching determining based on the sensor is more complex and a misoperation is more likely to occur. Therefore, a manner in which a part of the screen is limited only when the intelligent screen switching switch is turned on can reduce misoperations. The user can enable or disable an intelligent screen switching function on a settings interface.

If the intelligent screen switching switch is in an enabled state, it may be because that the intelligent screen switching function determines that the secondary screen needs to be lit up. If the secondary screen is lit up, it may be inconvenient for the user to answer an incoming call (for a specific reason, refer to the foregoing description). Therefore, in this case, how to display an incoming call display interface needs to be controlled according to the display control manner 1.

Figure 10:
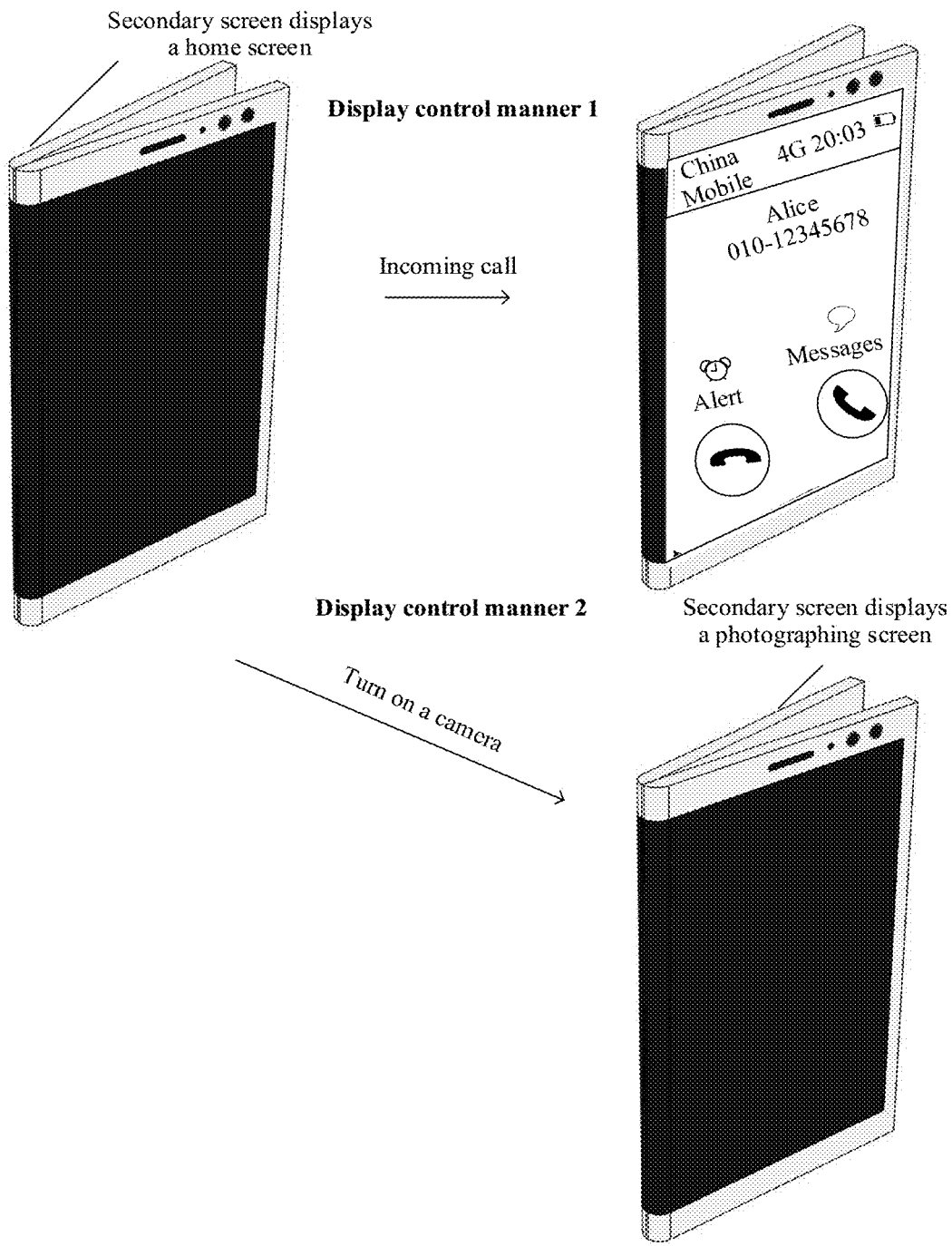
FIG. 10 is another schematic diagram of an incoming call when an electronic device is in a screen-off state according to an embodiment of this application.

Further, the mobile phone performs step 1041 to determine whether a current screen status is unfolded or folded. If the screen is in the unfolded state (or an expanded state, as shown in the left figure of FIG. 5A), step 106 is performed to light up the primary screen and the secondary screen, that is, the large screen is used to display an incoming call interface corresponding to the foregoing incoming call event. For example, as shown in the right figure of FIG. 5A, the large screen displays an incoming call interface in which a calling party is Alice. In addition to the calling party's name and phone number 010-12345678, the incoming call interface also includes a hang-up control, an answer control, a reminder control, and a message control. The incoming call interface is only an example. In actual product implementation, content displayed on the incoming call interface may be adjusted. If the screen is in the folded state (or a collapsed state, for example, a state shown in the upper left figure of FIG. 10), the primary screen is lit up, that is, the primary screen is used to display the incoming call interface corresponding to the foregoing incoming call event, as shown in the upper right figure of FIG. 10. The incoming call interface is similar to the incoming call interface shown in the right figure of FIG. 5A, and details are not described herein again.

If the intelligent screen switching switch is in a disabled state, a manner of determining how to display the incoming call interface also needs to be provided. Because the intelligent screen switching switch is disabled, in some implementations, the user can only trigger switching of display on the screen by using the explicit operation (for example, tap a displayed screen switching button or tap the screen). Such switching can generally reflect a real intention of the user. Therefore, in this case, switching to the secondary screen may not be limited. This embodiment of the present disclosure provides the display control manner 2. Different from the display control manner 1, the display control manner 2 does not avoid the secondary-screen display.

In some implementations, although the intelligent screen switching switch is turned off, the intelligent screen switching function may still be implemented in the display control manner 2. To be specific, the user may also change the display status of the screen by changing the folded or unfolded state, the screen orientation, or the like of the electronic device.

Further, the mobile phone performs step 1042, to determine whether the current screen status is unfolded or folded. It may be understood that a determining process in step 1042 is the same as that in step 1041. Refer to the foregoing description about the status monitoring service.

If the screen is in the unfolded state, the mobile phone also performs step 106, that is, the large screen displays the incoming call interface corresponding to the foregoing incoming call event. If the screen is in the folded state, the screen may be further determined with reference to the orientation of the screen and the holding posture of the user. For example, if the primary screen of the mobile phone faces the user and a palm of the user does not block the primary screen, step 105 is performed, that is, the primary screen displays the incoming call interface. If the secondary screen of the mobile phone faces the user and the palm of the user does not block the secondary screen, step 107 is performed, that is, the secondary screen displays the incoming call interface. Other conditions may also be used to determine the primary-screen display or the secondary-screen display. For example, a screen that faces upward is selected for display only based on the screen orientation, or an unblocked screen is selected for display only based on the holding posture of the user. In this embodiment of the present disclosure, a screen to be lit up may be further determined based on the screen switching event. For example, if the screen switching event is triggered by tapping the secondary screen, the secondary screen is lit up. This is not limited.

In some embodiments, step 103 of determining whether the intelligent screen switching switch is enabled may be omitted. The mobile phone uses the display control manner 1 only during a period from a moment at which the incoming call event arrives to a moment at which the call ends (for example, the user rejects the call, hangs up because the call is not connected due to timeout, or hangs up after the call), and the mobile phone uses the display control manner 2 before an incoming call and after the call ends.

In some embodiments, step 102 may be replaced with detecting that the earpiece starts to work. In this case, step 103 is not performed based on the incoming call event, but a display manner to be used is determined based on the working status of the earpiece. Alternatively, step 103 may be omitted. For example, the mobile phone uses the display control manner 1 as long as the earpiece is in use, and the mobile phone uses the display control manner 2 as long as the earpiece is not in use.

In some embodiments, during the period from the moment at which the incoming call event arrives to the moment at which the call ends, or during the working of the earpiece, whether the camera is enabled may be further determined. If the camera is enabled, the user may use front-facing photographing (that is, a selfie function). Only the secondary screen is disposed with the camera. Therefore, in this case, the secondary-screen display needs to be allowed, that is, the mobile phone uses the display control manner 2. If the camera is not enabled during the period from the moment at which the incoming call event arrives to the moment at which the call ends or during the working of the earpiece, the mobile phone uses the display control manner 1, so that the user can conveniently operate and view the user interface when answering the call by using the earpiece.

Figure 12:
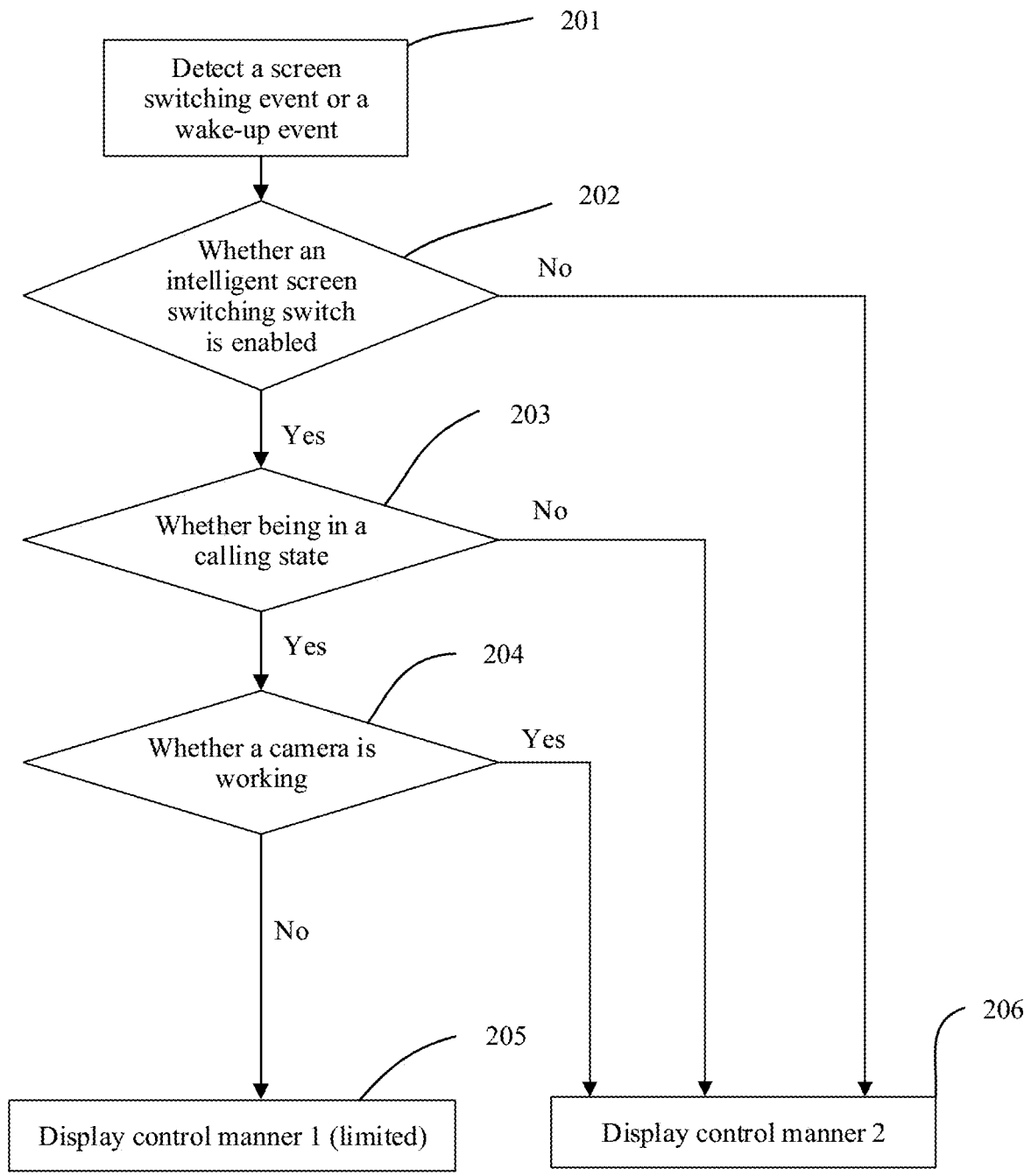
FIG. 12 is another processing flowchart of an electronic device according to an embodiment of this application.

In some embodiments, another processing flowchart may be used to respond to the wake-up event when the screen is off, for example, a processing procedure shown in FIG. 12. The wake-up event herein includes an event triggered by pressing the power button by the user, an alarm alert event, the incoming call event, an event triggered by switching the screen from the fold state to the unfolded state by the user, the fingerprint unlock operation, an event triggered by plugging or unplugging the USB data line, and the like. The screen switching event herein includes the event triggered by the explicit operation of the user and the screen switching event supported by intelligent screen switching.

If the mobile phone detects the incoming call event in the screen-off state (for example, step 201), the mobile phone determines whether the intelligent screen switching switch is currently enabled (for example, step 202).

If the intelligent screen switching switch is turned on, step 203 continues to be performed, and the mobile phone determines whether the mobile phone is currently in a calling state. If the mobile phone is in the calling state, step 204 is performed to determine whether the camera is working. If the camera is working, switching to the secondary screen is allowed even if the camera is in a call, that is, step 206 is performed to use the display control manner 2. If the camera does not work, step 205 is performed to use the display control manner 1.

If the intelligent screen switching switch is turned off, step 206 continues to be performed, and the mobile phone determines, by using the display control manner 2, a manner in which the incoming call interface should be displayed.

It should be noted that the foregoing description of intelligent screen switching in FIG. 11 is also applicable to intelligent screen switching in FIG. 12, and details are not repeated herein.

FIG. 12 may be used to determine how to display the screen switching event or the wake-up event to respond to the event. Therefore, steps 202, 203, and 204 are used to determine a current status of the mobile phone when the screen switching event or the wake-up event is detected. A person skilled in the art may understand that, because the screen switching event or the wake-up event occurs first in time, and a subsequent determining step occurs later in time, "when the screen switching event or the wake-up event is detected" is not completely synchronized in time.

In some embodiments, a sequence of steps 201, 202, 203, and 204 may be reversed, that is, as long as the following four conditions are met: (a) the screen switching or wake-up event occurs, (b) an intelligent switch is turned on, (c) a call is ongoing, and (d) the camera is not enabled, the display control manner 1 is used, and when one or more of the foregoing four conditions are not met, the display control manner 2 is used.

In some embodiments, step 203 may be replaced with determining whether the earpiece is working, or replaced with determining whether the microphone is working, or replaced with determining whether an application that invokes the earpiece is started, or is running, or is being displayed in the foreground, for example, a call application, a music player, or a voice assistant application, or replaced with whether an application that invokes the microphone is started, is running, or is being displayed in the foreground, for example, the call application, a recording application, or the voice assistant application.

In some embodiments, step 204 may be replaced with determining whether a scanning function of a camera application or a WECHAT application, or another application or function that invokes the camera is enabled.

In some embodiments, some of steps 202, 203, and 204 may be omitted. For example, step 202 may be omitted, and only step 203 and step 204 are retained. Alternatively, step 204 is omitted, and only step 202 and step 203 are retained. Alternatively, step 203 is omitted, and only step 202 and step 204 are retained. Optionally, only step 203 may be retained, or only step 204 may be retained, that is, step 203 is performed after step 201, or only step 204 is performed after step 201.

Figure 13A:
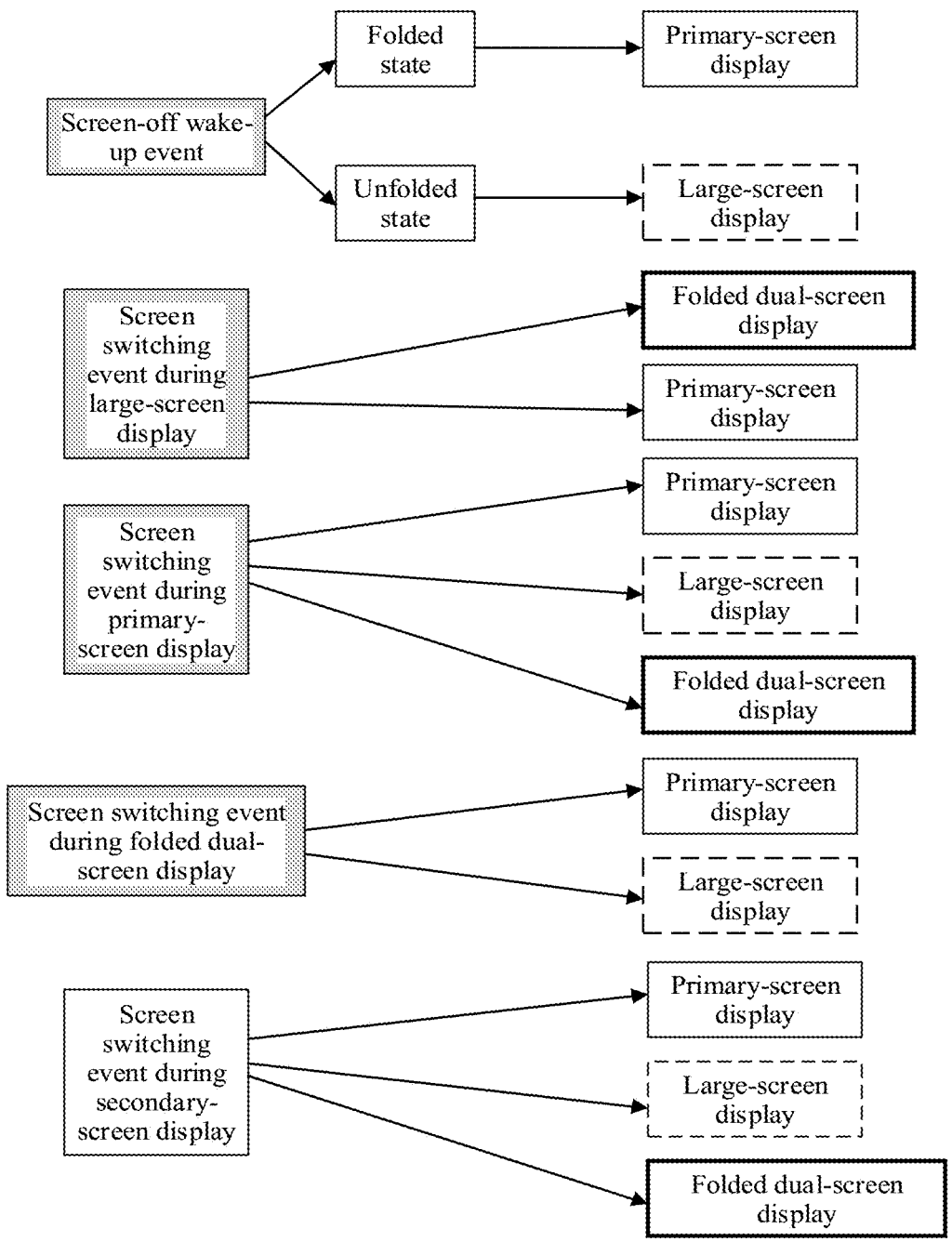
FIG. 13A and FIG. 13B are a schematic diagram of a display control manner 1 and a display control manner 2 according to an embodiment of this application.
Figure 13B:
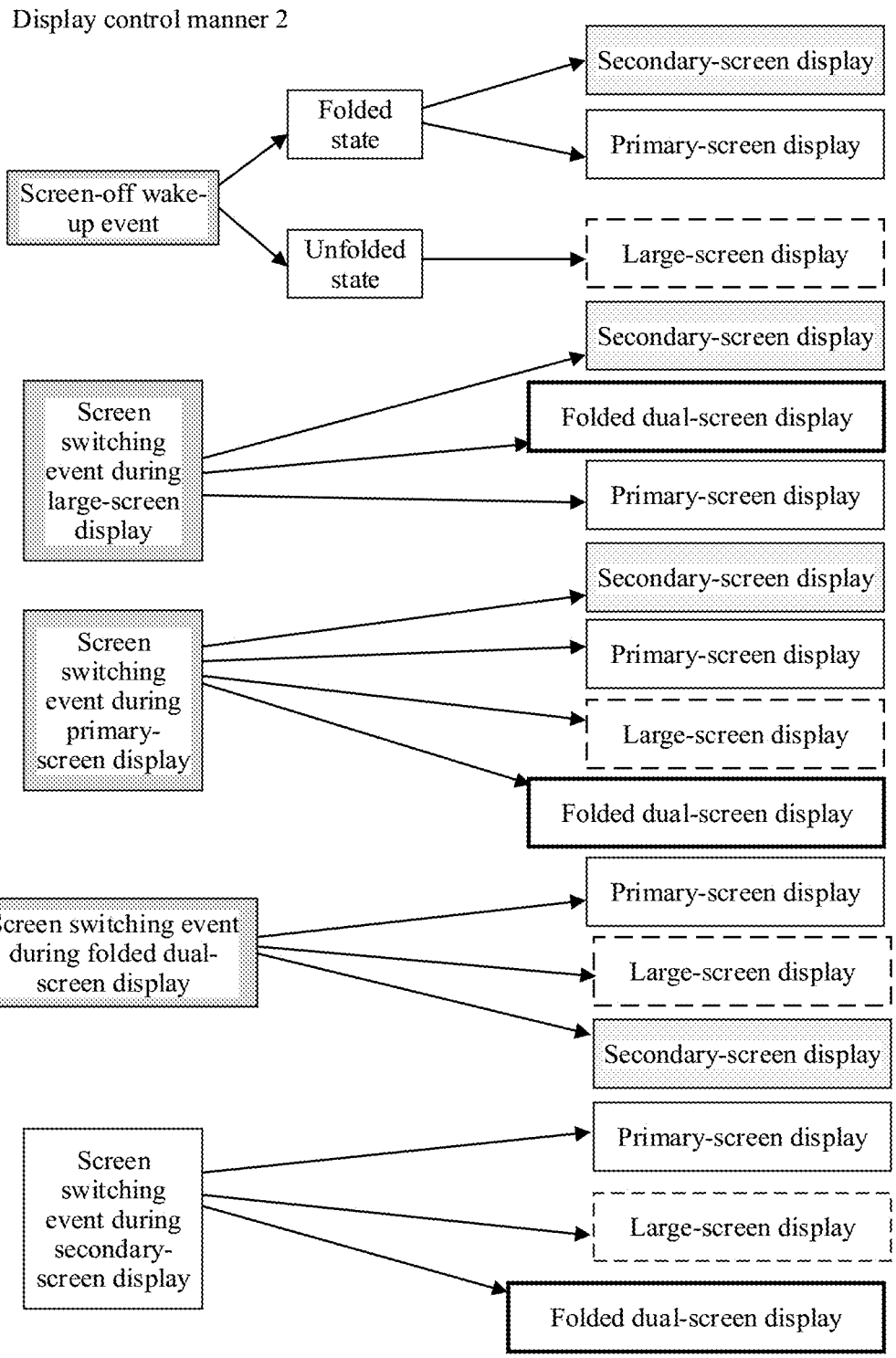

For the display control manner 1 and the display control manner 2, refer to an example provided in a schematic diagram of a display control manner shown in FIG. 13A and FIG. 13B. FIG. 13A and FIG. 13B provide display manners to be used when the wake-up event or the screen switching event is received in some screen statuses. It may be found that the display control manner 1 does not include the secondary-screen display, and the display control manner 2 includes the secondary-screen display.

As shown in FIG. 13A and FIG. 13B, because the incoming call event is the wake-up event in the screen-off state, the display manner further needs to be determined based on the status of the screen when an off-screen wake-up event is received. In the display control manner 1, if the screen is currently in the folded state, the primary screen is used to display the incoming call interface, or if the screen is currently in the unfolded state, the large screen is used to display the incoming call interface (as shown in the right figure in FIG. 5A). In the display control manner 1, if the screen is currently in the unfolded state, the large screen is still used to display the incoming call interface. However, when the screen is currently in the folded state, whether to use the primary-screen display or the secondary-screen display may be determined based on another factor. For details, refer to the foregoing description about FIG. 11. Details are not repeated herein.

After the primary screen, the secondary screen, or the large screen is used to display the incoming call interface, the user may reject the incoming call or answer the call. In a process of answering the call, a screen close to the user may display a call interface, such as a call interface displayed on the large screen shown in the left figure of FIG. 5B. In this case, some events that may trigger screen display switching, that is, the following scenario (2), may be further detected.

(2) The screen switching event is detected during the large-screen display.

When the mobile phone is in the large-screen display, if some screen switching events are detected, for example, events triggered by an operation such as the user flips the mobile phone, the user taps a switching button, or the user folds the mobile phone, how to perform display also needs to be determined.

Figure 5A:
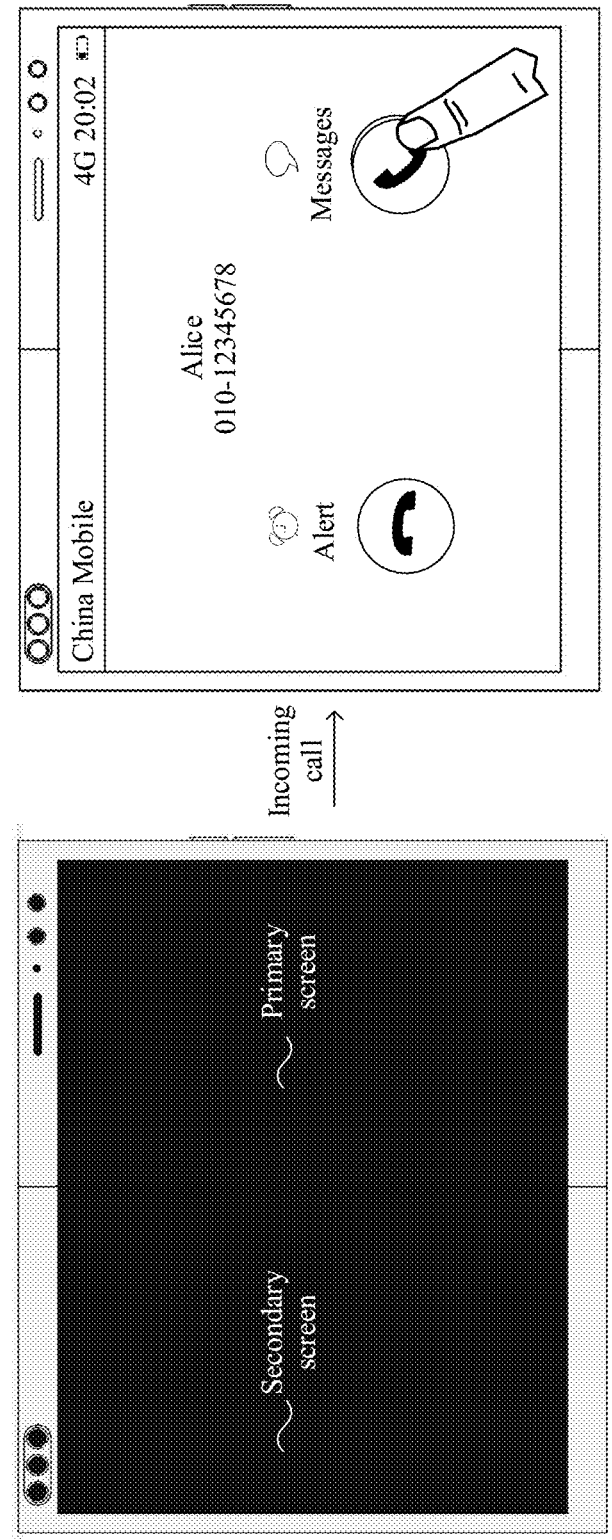
FIG. 5A is a schematic diagram of an incoming call when an electronic device is in a screen-off state according to an embodiment of this application.
Figure 5B:
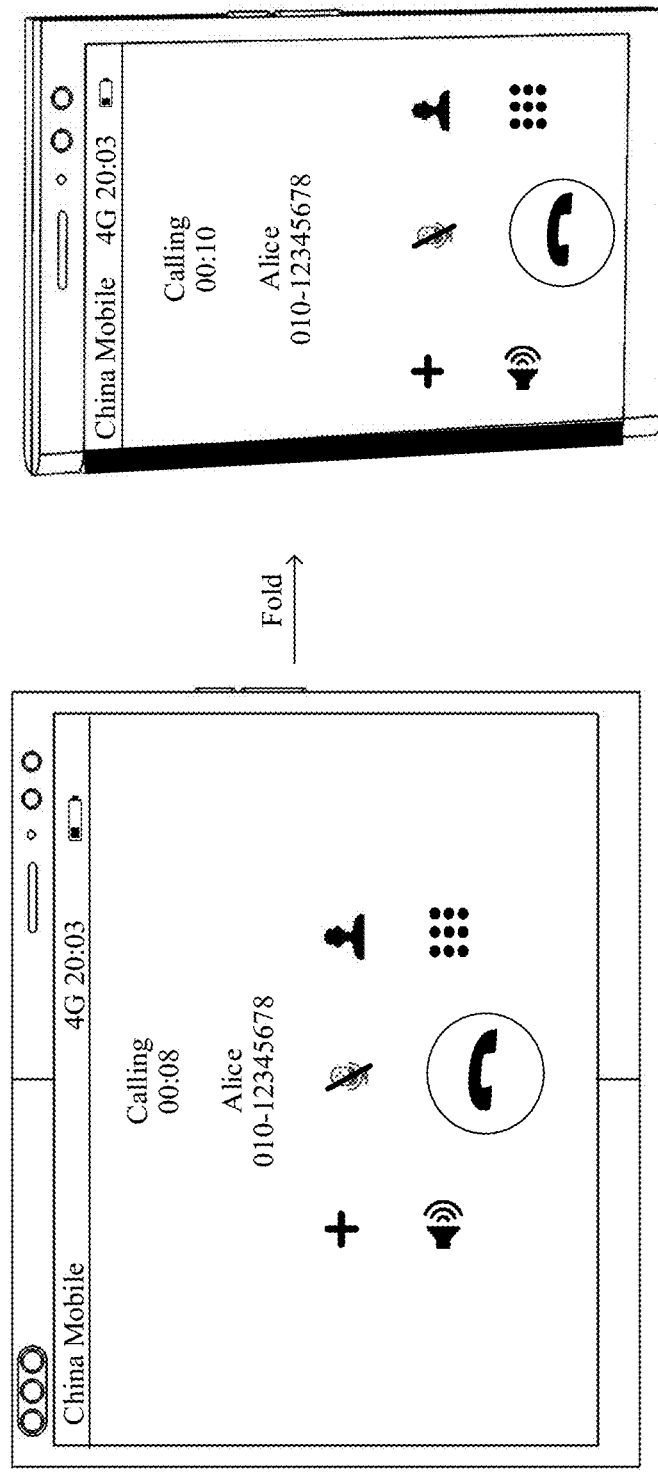
FIG. 5B is a schematic diagram of an electronic device from an unfolded state to a folded state according to an embodiment of this application.

FIG. 5B is used as an example. The left figure is a schematic diagram in which the mobile phone is in the unfolded state and the large screen displays the call interface. In this case, if it is detected that the user folds the screen from the unfolded state to the folded state (for example, as shown in the right figure in FIG. 5B), how to perform display in the folded state needs to be determined.

Assuming that the intelligent screen switching switch is in the enabled state, it may be determined based on the processing procedure in FIG. 12 that, because the mobile phone is currently in the calling state and the camera is not enabled, the display control manner 1 should be used to select a screen for display. Further, based on the display control manner 1 shown in FIG. 13A, it can be learned that, if the screen switching event is detected during the large-screen display, it may be further determined, based on another condition, that the folded dual-screen display or the primary-screen display is used. For example, if the primary screen of the mobile phone in the folded state currently faces upward or the primary screen faces the user, the call interface may be displayed on the primary screen, as shown in the right figure in FIG. 5B. If the mobile phone is in the folded state, the user separately holds the secondary screen and the primary screen with the left and right hands, the folded dual-screen display may be used. For example, for the mobile phone in the folded state, the primary screen and secondary screen may separately display a same interface or different interfaces toward different users, so that different users can conveniently view the displayed interface.

Herein, a condition for determining whether to use the primary-screen display or the folded dual-screen display is merely an example, and another condition may be used. This is not limited in this embodiment of the present disclosure, but the secondary-screen display is not allowed in the display control manner 1. After the display manner is determined, the determined screen displays the call interface. If the user also performs another operation in a folding process, for example, hangs up the call, or invokes another interface, for example, taps an address book button in the call interface, the determined screen displays an interface corresponding to the other operation.

Figure 8A:
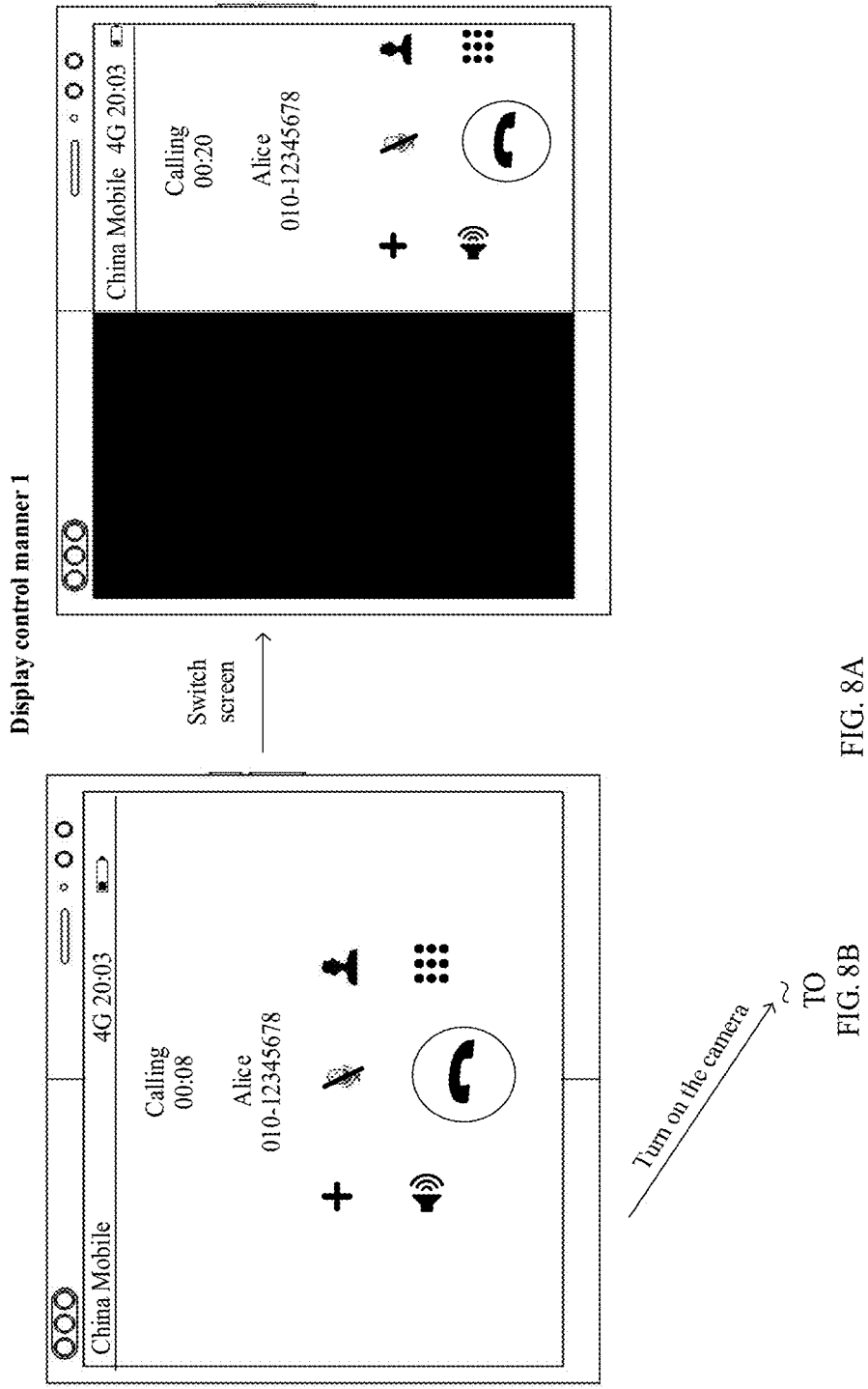
FIG. 8A and FIG. 8B are a schematic diagram of display control in large-screen display of an electronic device according to an embodiment of the present disclosure.
Figure 8B:
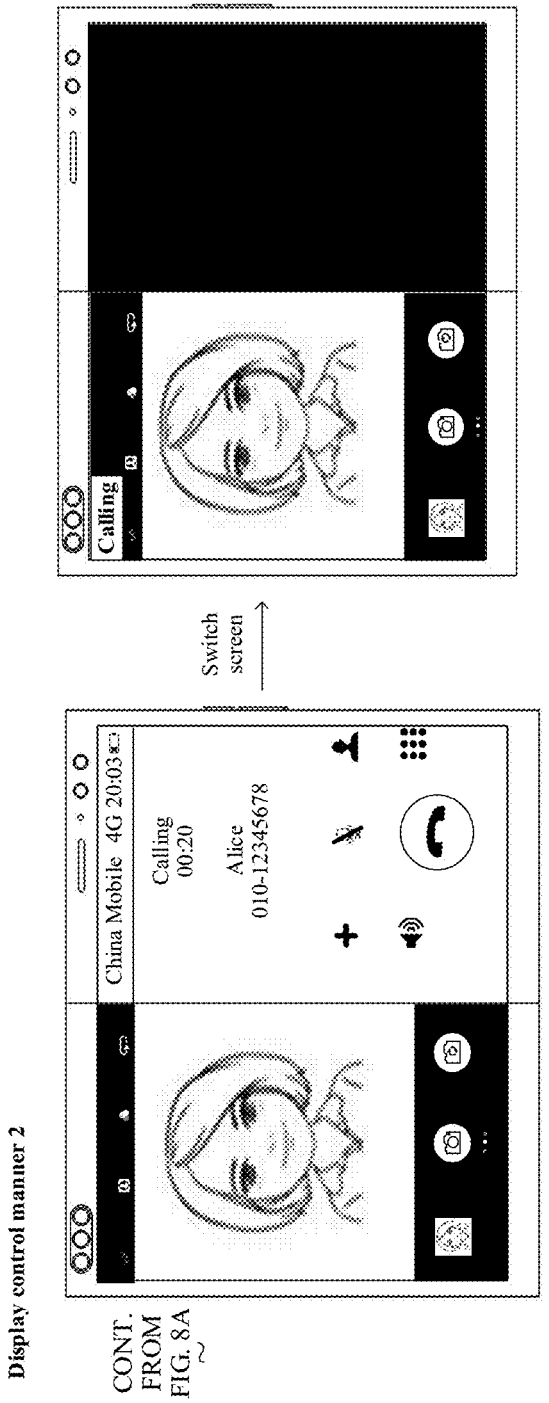

FIG. 8A and FIG. 8B are further used as an example for description. The left figure of FIG. 8A is a schematic diagram in which the mobile phone is in the unfolded state and the large screen displays the call interface. It is assumed that the intelligent screen switching switch is in the enabled state, if a screen switching event triggered by double-tapping the secondary screen by the user is detected, according to the processing procedure in FIG. 12, it may be determined that the display control manner 1 is used to select the screen for display. Further, based on the display control manner 1 shown in FIG. 13A, it can be learned that, if only the primary screen of the mobile phone in the unfolded state is held by the user, the primary-screen display is selected, as shown in the right figure in FIG. 8A.

Assuming that the intelligent screen switching switch is in the enabled state, if the mobile phone is in the unfolded state and the large screen displays the call interface, the user does not hang up the call, and starts the camera application by using a shortcut gesture or first returning to a home screen that displays an icon of the camera application and then tapping the icon of the camera application. In this case, the large screen is still used for display. The secondary screen may display an interface of the camera application, and the primary screen may still display the call interface, as shown in the left figure in FIG. 8B. If the holding posture of the user changes when the mobile phone displays an interface shown in the left figure of FIG. 8B, and the screen switching event is triggered, assuming that the intelligent screen switching switch is in the enabled state, it may be determined based on the processing procedure in FIG. 12 that when the camera is enabled in the call, the display control manner 2 should be used to select the screen for display. Further, it can be learned based on the display control manner 2 shown in FIG. 13B that the large-screen display may be switched to the secondary-screen display, the folded dual-screen display, or the primary-screen display. If the holding posture of the user is changed from holding the secondary screen and the primary screen separately by hands to holding the secondary screen with one hand, the secondary-screen display is switched, for example, the interface of the camera application shown in the right figure in FIG. 8B.

(3) The screen switching event is detected during the primary-screen display.

When the mobile phone uses the primary screen for display, for example, as shown in the right figure in FIG. 5B, in this case, some events that may trigger screen display switching may be further detected. For example, the user flips the mobile phone, because flipping also triggers the screen switching event, in this case, determining how to perform display control is also triggered.

It may be determined based on the processing procedure in FIG. 12 that, because the mobile phone is currently in the calling state and the camera is not enabled, the display control manner 1 should be used to select the screen for display. Further, based on the display control manner 1 shown in FIG. 13A, it can be learned that, if the screen switching event is detected during the primary-screen display, it may be set to continue the primary-screen display, switch to the large-screen display, or switch to the folded dual-screen display.

Figure 6:
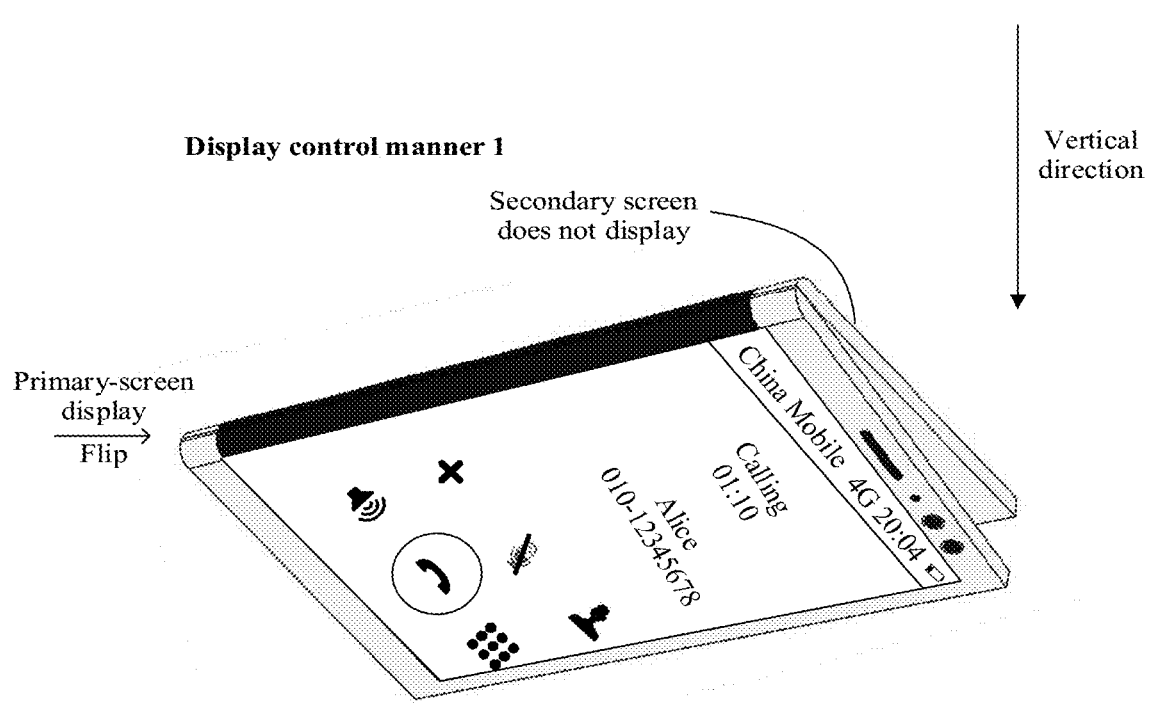
FIG. 6 is a schematic diagram of flipping in primary-screen display of an electronic device according to an embodiment of this application.

For example, when the call progresses to 1 minute and 10 seconds, the user flips the mobile phone from a state in which the mobile phone is placed vertically as shown in the right figure in FIG. 5B to a state in which the primary screen faces downward as shown in FIG. 6, and may continue to use the primary screen to display an interface, such as the call interface shown in FIG. 6.

If the user changes the mobile phone from the folded state shown in the right figure in FIG. 5B to the unfolded state, the mobile phone may switch from the primary-screen display to the large-screen display, for example, display the call interface.

If the user changes the mobile phone from the folded state shown in the right figure in FIG. 5B to a folded state in which an included angle between the primary screen and the secondary screen is greater than a specific angle, for example, the included angle becomes 45 degrees, the mobile phone may switch from the primary-screen display to the folded dual-screen display.

Herein, a condition for determining whether to use the primary-screen display, the large-screen display, or the folded dual-screen display is merely an example, and another condition may be used. This is not limited in this embodiment of the present disclosure, but the secondary-screen display is not allowed in the display control manner 1.

Figure 7:
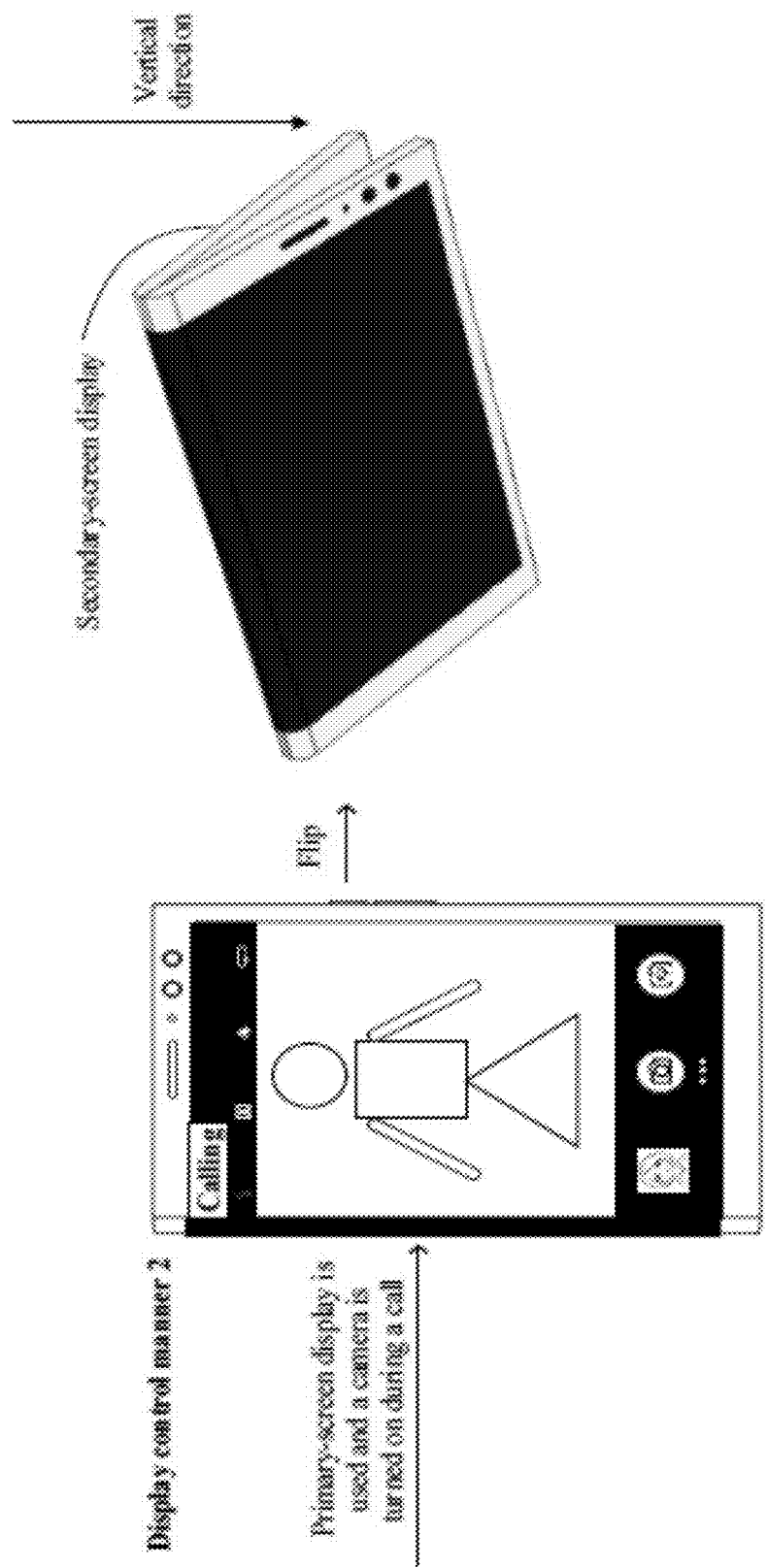
FIG. 7 is a schematic diagram of another flipping in primary-screen display of an electronic device according to an embodiment of this application.

In the interface shown in the right figure in FIG. 5B, for example, when the call progresses to 10 seconds, the user does not hang up the call, and opens the camera application by using the shortcut gesture, or first returns to the home screen that displays the icon of the camera application, and then taps the icon of the camera application to open the camera application, In this case, the home screen displays the interface of the camera application, as shown in the left figure in FIG. 7. Optionally, a status indication of "in a call" may be further displayed on an upper left corner on the interface of the camera application. At this time, if the user wants to photograph clouds in the sky by using the camera located on the secondary screen, and flips the mobile phone, how to perform display control is triggered again.

Still refer to FIG. 12. It is assumed that the intelligent switch is in the enabled state. When the flip operation is detected, the mobile phone is in the calling state and the camera is working. Therefore, the display control manner 2 should be used to allow the secondary-screen display, so that it is convenient for the user to perform an operation such as front-facing photographing by using the camera on the secondary screen.

Further, based on the display control manner 2 shown in FIG. 13B, it can be learned that, if the screen switching event is detected during the primary-screen display, it may be set to continue the primary-screen display, switch to the large-screen display, switch to the folded dual-screen display, or switch to the secondary-screen display.

For example, if the user flips the mobile phone to make the secondary screen face upward, as a state shown in the right figure in FIG. 7, the mobile phone may display the interface of the camera application on the secondary screen.

Figure 14A:
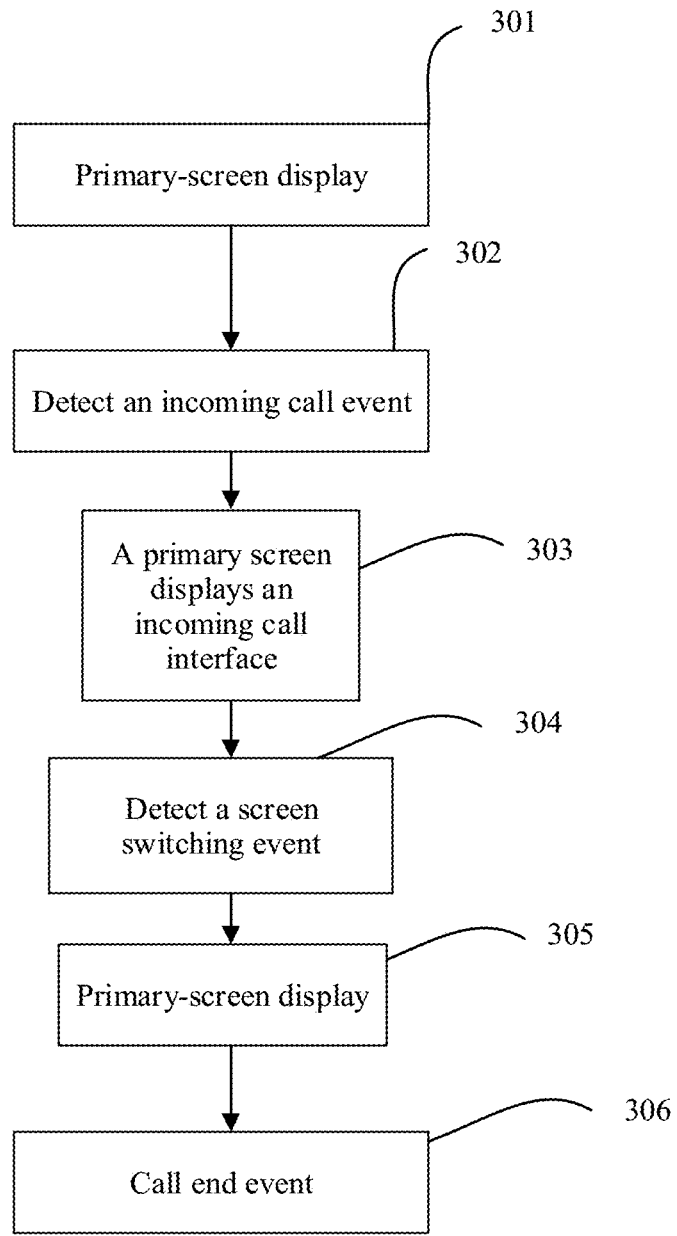
FIG. 14A is a processing flowchart of an incoming call in primary-screen display of an electronic device according to an embodiment of this application.

When the mobile phone uses the primary-screen display, processing may be further performed by using the flowchart provided in FIG. 14A. When the primary screen displays the home screen including a plurality of application icons (for example, step 301), if the incoming call event is detected (for example, step 302), step 303 is performed, that is, the incoming call interface is displayed on the primary screen. Before the call ends (step 306), if the screen switching event is detected (for example, step 304), the primary-screen display is maintained (for example, step 305). In this embodiment, when the primary screen is already displayed during the call, the primary-screen display is locked even if the screen switching event is received, and another display manner is not switched, so that the display of the electronic screen is consistent before the incoming call and during the call, no change of display triggered by an unintentional operation in the call process occurs, and the user's operation is more convenient and smoother.

It may be understood that herein, only the call application and the primary-screen display are used as examples. The person skilled in the art may alternatively replace the call application with another application, and replace the primary-screen display with another screen-on manner provided in Table 1 in this embodiment of the present disclosure.

Herein, in addition to considering whether the call is in progress, whether the earpiece is in the working state may be further considered. For example, the primary-screen display is locked only when the earpiece is used during the call.

(4) The screen switching event is detected during the folded dual-screen display.

When the mobile phone uses the folded dual-screen display, some events that may trigger screen display switching may be further detected. For example, the user flips or expands the mobile phone, because the flip or expanding operation also triggers the screen switching event, in this case, determining how to perform display control is also triggered.

Figure 9A:
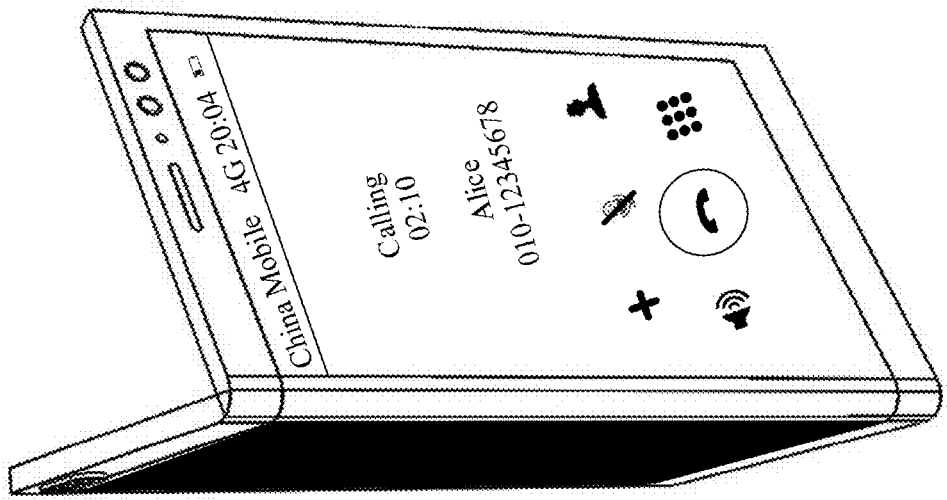
FIG. 9A and FIG. 9B are a schematic diagram of display control in folded dual-screen display of an electronic device according to an embodiment of the present disclosure.
Figure 9A:
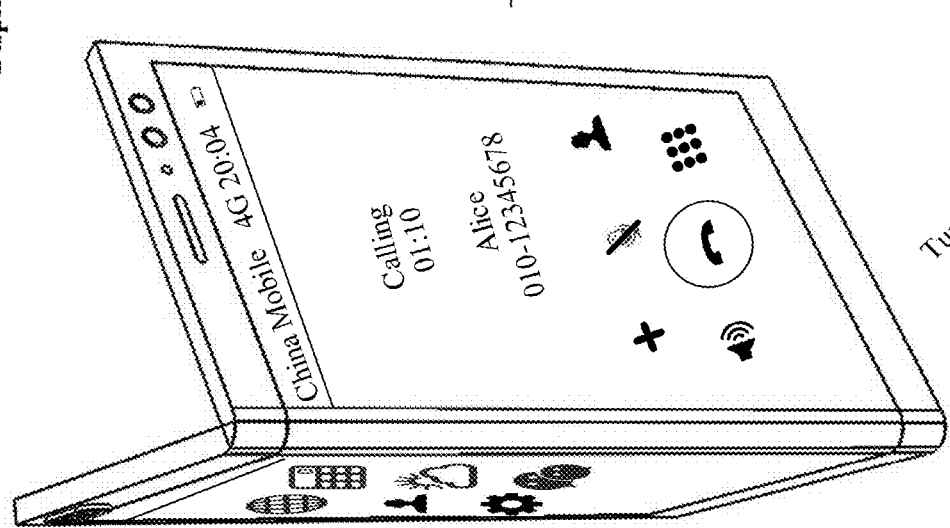

For example, as shown in the left figure in FIG. 9A, both screens of the mobile phone in the folded state display the user interface. The secondary screen displays the home screen including a plurality of application icons, and the primary screen displays the call interface. When detecting the screen switching event triggered by the flip or expanding operation of the user, the mobile phone determines, based on a current calling state, that the display control manner 1 should be used. Based on the display control manner 1 shown in FIG. 13A, the folded dual-screen display may be switched to the primary-screen display or the large-screen display. If the user performs the flip operation to make the primary screen face the user, the interface may switch to be displayed on the primary screen, as shown in the right figure in FIG. 9A. If the user performs the expanding operation to make the screen in the unfolded state, the call interface may switch to be displayed on the large screen, which is similar to the left figure in FIG. 8A.

When the mobile phone call progresses to 1 minute and 10 seconds (as shown in the left figure in FIG. 9A), in order to complete real-name authentication in a financial application, the user enables the camera to photograph and upload a front photo, and the folded dual-screen display is still used. As an example, the primary screen in the left figure in FIG. 9A displays a user interface of a facial recognition function, and the secondary screen displays the call interface. Optionally, display content of the primary screen and the secondary screen may also be exchanged. If the screen switching event that is triggered by the flip or expanding operation of the user is detected at this time, the mobile phone determines, based on the current calling state while the photographing function of invoking the camera is in the enabled state, that the display control manner 2 should be used. Based on the display control manner 1 shown in FIG. 13A, the folded dual-screen display may be switched to the primary-screen display, the large-screen display, or the secondary-screen display.

Figure 9B:
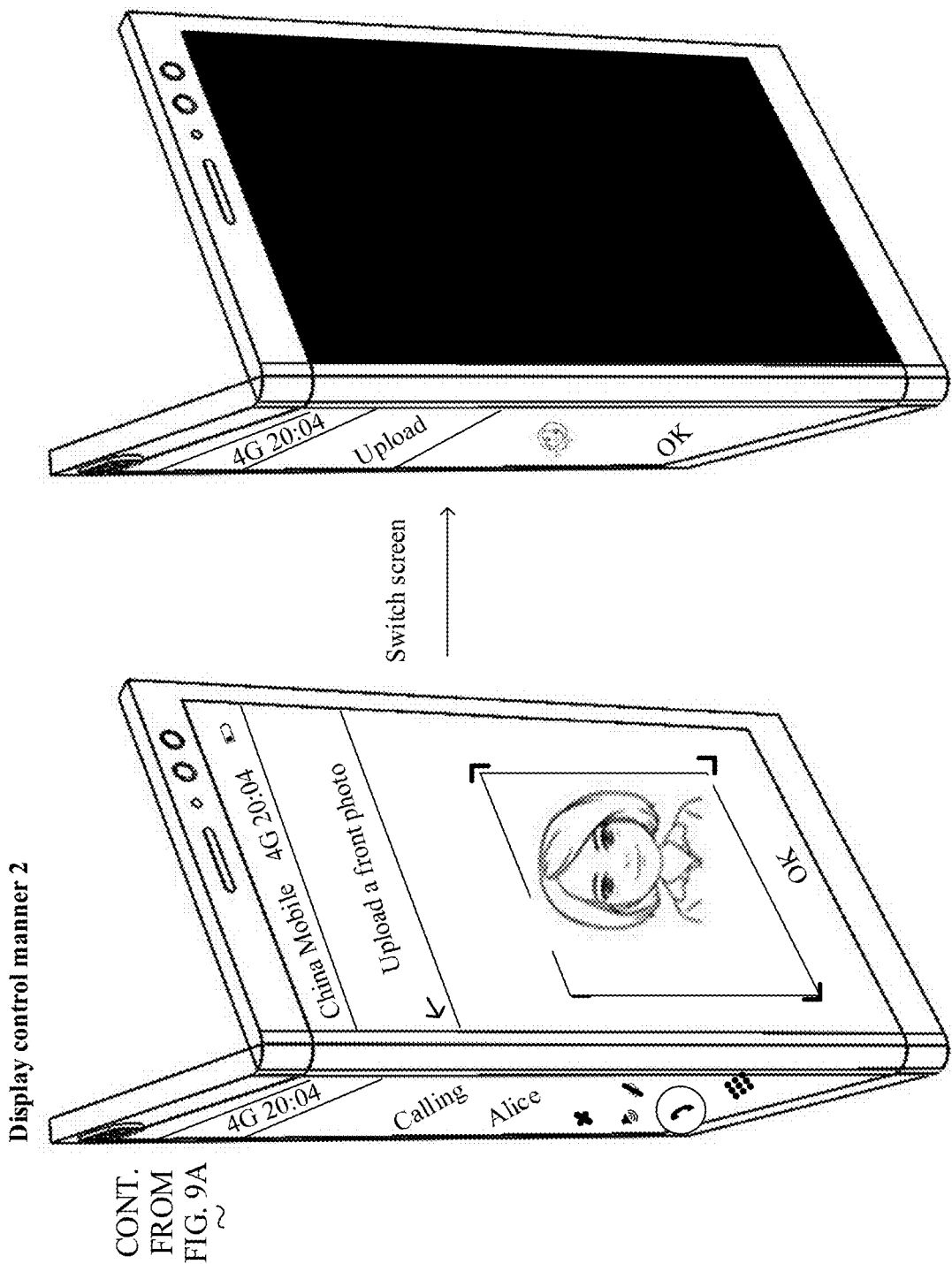

If the flip operation of the user makes the secondary screen face the user, the secondary-screen display is switched to. For example, as shown in the right figure in FIG. 9B, the secondary screen continues to display an interface corresponding to the photographing function, and the call application is switched to the background and is not displayed on the interface. Optionally, the calling state may be superimposed and displayed on the interface corresponding to the photographing function on the secondary screen, or a control of the call interface may be switched to. This is not limited in the present disclosure.

If the expanding operation of the user makes the screen change to be in the unfolded state, the large-screen display is switched to. If the flip operation of the user makes the primary screen face the user, the primary-screen display is switched to. Herein, a condition for switching to the large-screen display or the primary-screen display is merely an example, and the person skilled in the art may understand that the condition may be another condition.

(5) The screen switching event is detected during the secondary-screen display.

If the mobile phone detects an event that may trigger screen display switching when using the secondary-screen display, the mobile phone may determine, according to the flowchart in FIG. 12, whether to use the display control manner 1 or the display control manner 2. The determining manner herein is similar to the determining manner in the foregoing scenario, and is not repeated herein. Further, refer to FIG. 13A and FIG. 13B. Switching settings for the secondary-screen display in the display control manner 1 and the display control manner 2 provided in FIG. 13A and FIG. 13B are the same. The two display control manners both define that the mobile phone can switch from the secondary-screen display to the primary-screen display, the large-screen display, and the folded dual-screen display. For example, if the event that triggers screen switching is an operation of making the primary screen face the user, the secondary-screen display may be switched to the primary-screen display. For another example, if the event that triggers screen switching is triggered by expanding the screen in the folded state, the secondary-screen display may be switched to the large-screen display. For another example, if the event that triggers screen switching is triggered by changing from holding the secondary screen with one hand to holding the secondary screen and the primary screen respectively with the left and right hands, the secondary-screen display may be switched to the folded dual-screen display. Herein, a condition for determining whether to use the primary-screen display, the large-screen display, or the folded dual-screen display is merely an example, and another condition may be used. This is not limited in this embodiment of the present disclosure.

Switching control of the secondary-screen display is not distinguished in the display control manner 1 and the display control manner 2. In some implementations, when the switching event is detected when the secondary screen is used, the determining process shown in FIG. 12 may not be performed. In other words, if the switching event is detected when the secondary screen is used, step 202 to step 204 do not need to be performed, and step 205 or step 205 is directly performed.

(6) A screen-off event is detected when the screen is on.

In the foregoing various screen-on states, if the mobile phone detects the screen-off event, for example, triggered by tapping the power button or automatically turning off the screen periodically, a screen being displayed is off.

Figure 14B:
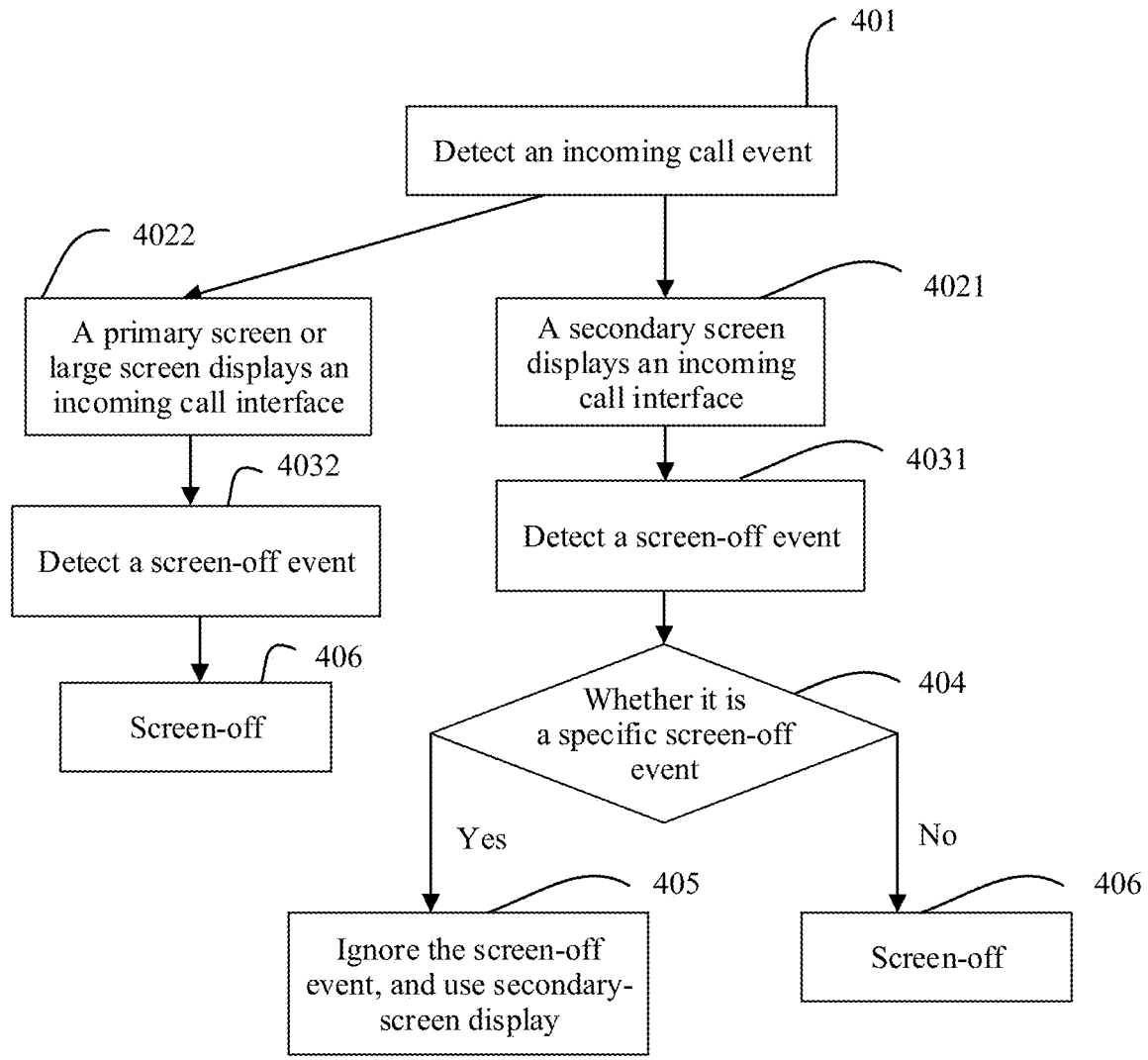
FIG. 14B is another processing flowchart of an incoming call of an electronic device according to an embodiment of this application.

In some embodiments, the screen-off event in the calling state of the mobile phone may be further distinguished. For example, refer to the processing flowchart of an incoming call in FIG. 14B. All steps in the figure occur before the incoming call ends. When the incoming call event is detected (step 401), if the mobile phone is in the black screen state, a screen on which the incoming call interface is displayed may be determined with reference to the description in the foregoing scenario (1). If the mobile phone is in the screen-on state, the incoming call interface continues to be displayed in the screen-on state. If the large screen or the primary screen is used to display the incoming call interface (step 4022), and the screen-off event is detected (step 4032), the mobile phone turns off the screen regardless of a type of the screen-off event.

If the secondary screen is used to display the incoming call interface (step 4021), and the screen-off event is detected (step 4031), it is further determined whether a type of the screen-off event is a specific screen-off event (step 404).

It should be noted that the screen-off event may be triggered by pressing the physical button (such as the power button) by the user, or automatically turning off the screen periodically (for example, the screen is turned off automatically after being on for 1 minute). Such screen-off event is not generated only in a call scenario, and may also be the specific screen-off event generated only in the calling state. These specific screen-off events may be automatically triggered by a distance sensor located only on the primary screen, or automatically triggered by a gravity sensor, a touchscreen, or the like (for example, some mobile phones that do not have a distance sensor use a gravity sensor or a touchscreen to trigger the screen-off event). Because these specific screen-off events are automatically triggered based on data detected by the component, when the secondary screen displays the call interface, if the secondary screen makes a screen-off response to all of these specific screen-off events, misdetermining may occur. For example, the user places the secondary screen upward and the primary screen downward on a desk. In this case, the secondary screen displays the incoming call interface. Because the primary screen is blocked by the desk, if a screen-off response is made to a screen-off event reported by a distance sensor located only on the primary screen, the user cannot operate the incoming call interface in the call process, thereby bringing inconvenience to the user.

Therefore, for the foregoing specific screen-off event, step 405 may be performed, that is, the specific screen-off event is ignored, and the secondary screen is still used for display. For another screen-off event that is not generated only in the call scenario, for example, triggered by pressing the power button by the user or automatically turning off the screen periodically, step 406 is performed, that is, turning off the screen, so as to ensure that the user can actively turn off the screen.

It should be noted that, in steps 4031 to 406, the display policy service may process the generated screen-off event. In some other embodiments, the screen-off event may not be generated for these specific components in the call process. For example, a hardware control manner may be used, that is, the component that triggers the specific screen-off event, such as the distance sensor and the gravity sensor, may be turned off during the call. Alternatively, in the call process, a status detection service does not listen to an event generated by these specific components. For example, for the distance sensor located only on the primary screen, the call application or the status detection service may not listen to the event reported by the distance sensor.

It should be noted that, in the descriptions of the foregoing scenarios (1) to (5), a body for determining which screen should be used for display may be the display policy service.

In the descriptions of the foregoing scenarios (1) to (5), only an example in which whether the camera, the earpiece, the microphone, the application or function that uses the camera, the application or function that uses the earpiece, or the application or function that uses the microphone is enabled is considered. For a component located only on the primary screen or only on the secondary screen, as long as the component needs to face or be as close as possible to the user during working, a working status of the component may also be used as a basis for determining display control. For example, an infrared sensor that is used for facial recognition and located only on the primary screen may be set as follows. During working of the infrared sensor used for facial recognition, or during running of an application or a function that invokes the infrared sensor used for facial recognition of the user, the display control manner 1 is used, that is, limit switching to the secondary-screen display. However, when the infrared sensor used for facial recognition does not work, or when the application or function that invokes the infrared sensor used for facial recognition of the user is disabled, the display control manner 2 is used.

The display control manner 1 and the display control manner 2 provided in FIG. 13A and FIG. 13B are merely examples. The display control manner 1 may include any one of the foregoing scenarios (1) to (5), and the display control manner 2 may also include any one of the foregoing scenarios (1) to (5). For each scenario, the display control manner 1 and the display control manner 2 may further have other settings, for example, the primary-screen display. Alternatively, the display control manner 1 may be set only to display on a corresponding primary screen, that is, lock the primary screen, and not switch to another manner. This is not limited in this embodiment of the present disclosure.

Figure 15A:
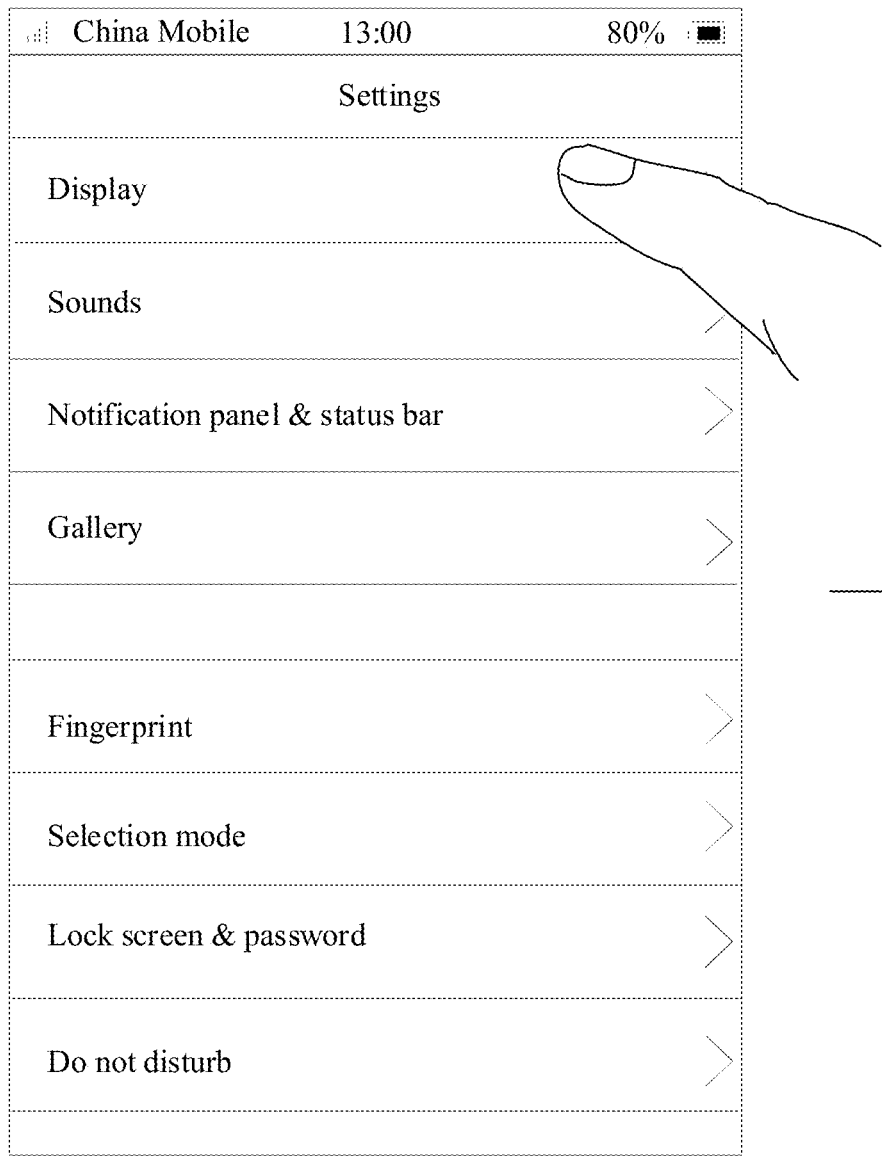
FIG. 15A, FIG. 15B, FIG. 15C, FIG. 15D, FIG. 15E, and FIG. 15F are diagrams of display settings interfaces according to an embodiment of this application.
Figure 15B:
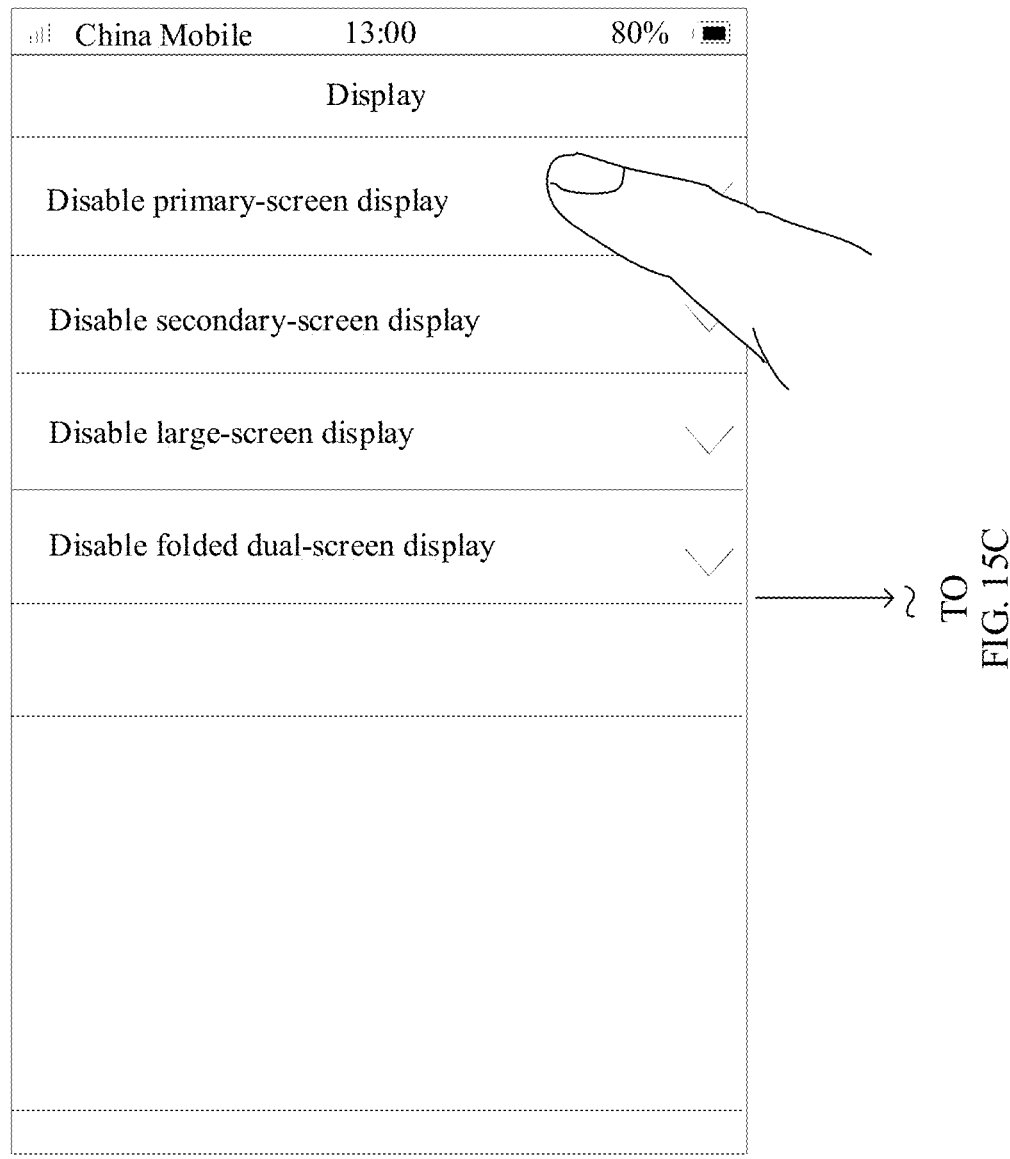
Figure 15C:
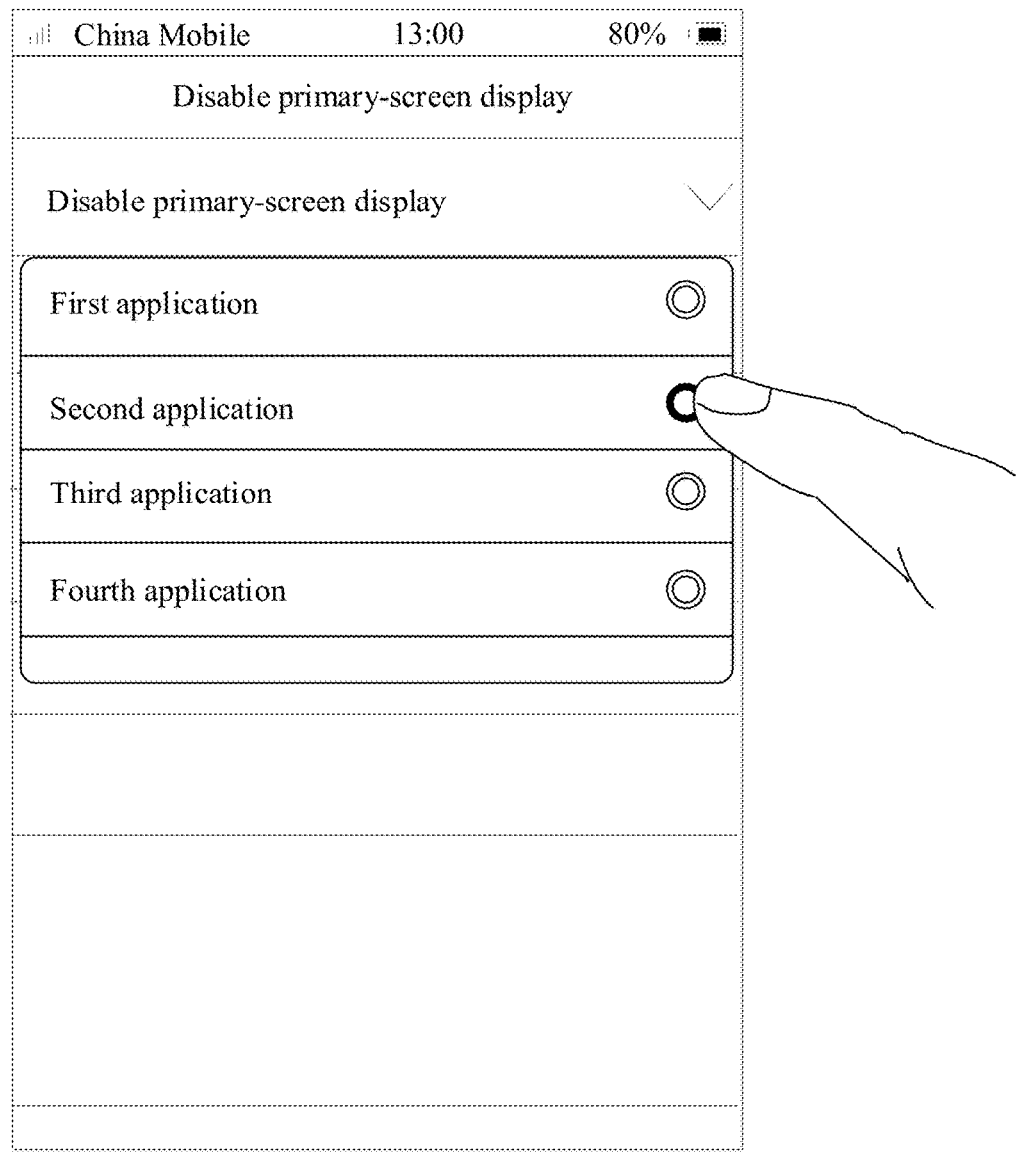
Figure 15D:
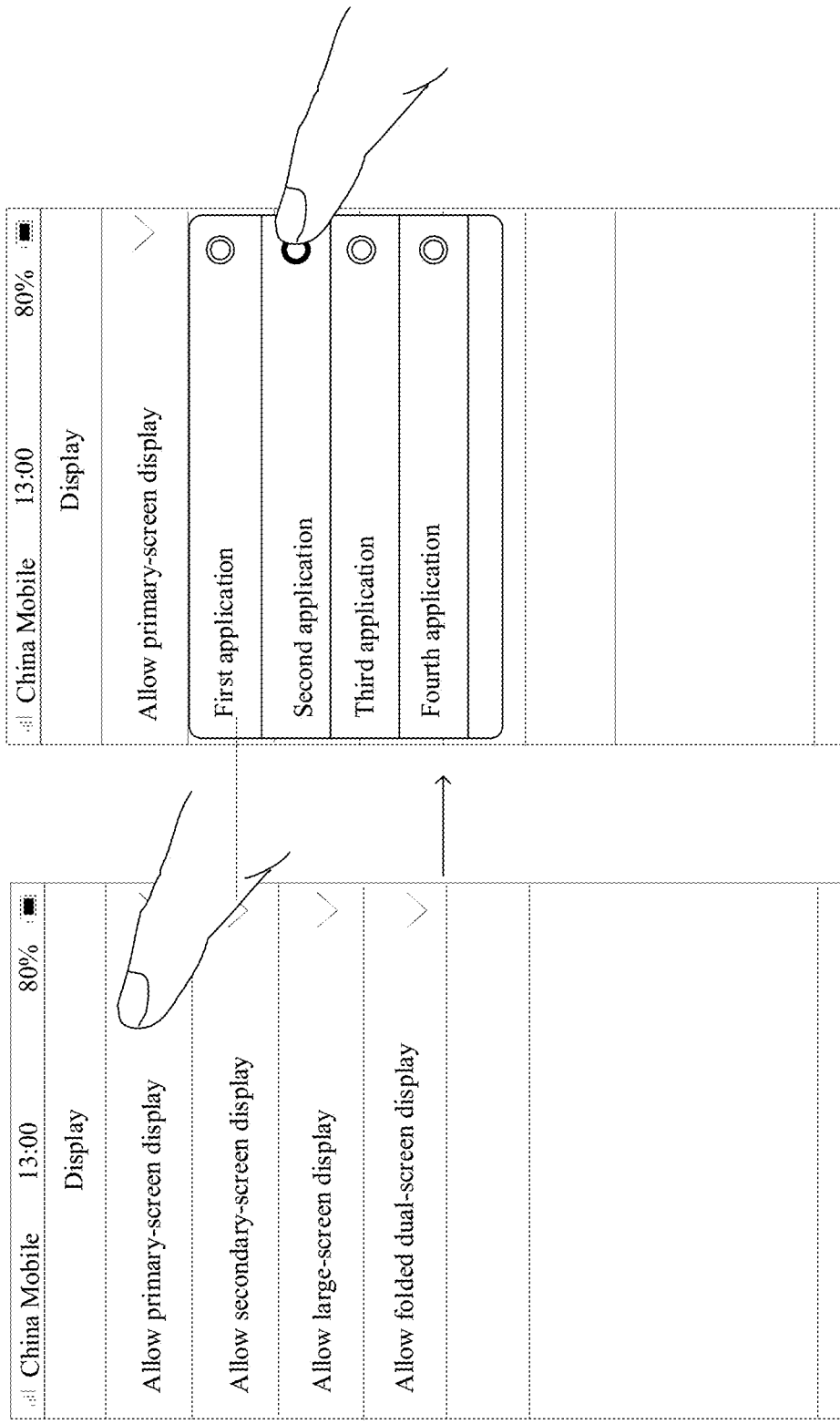
Figure 15E:
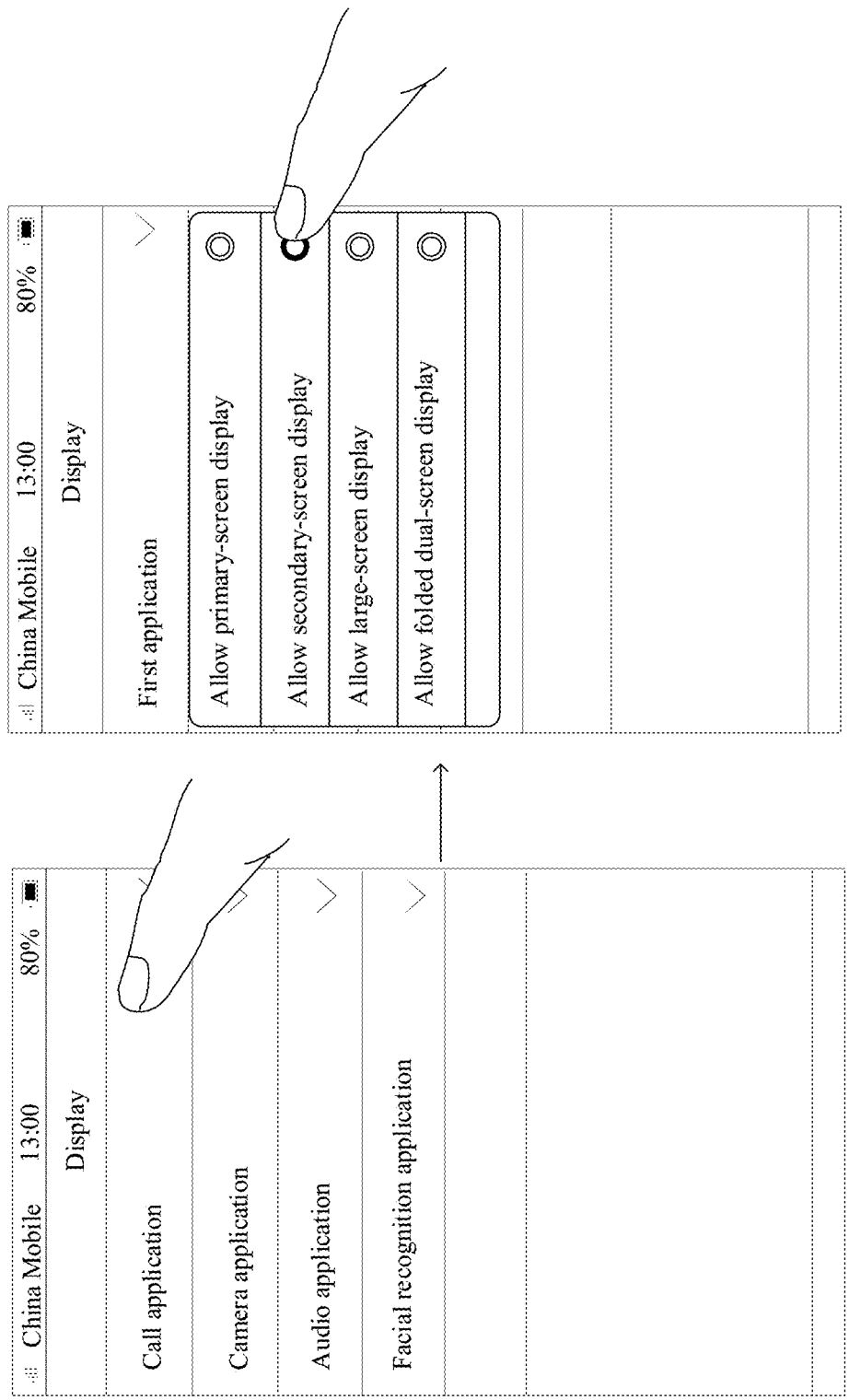
Figure 15F:
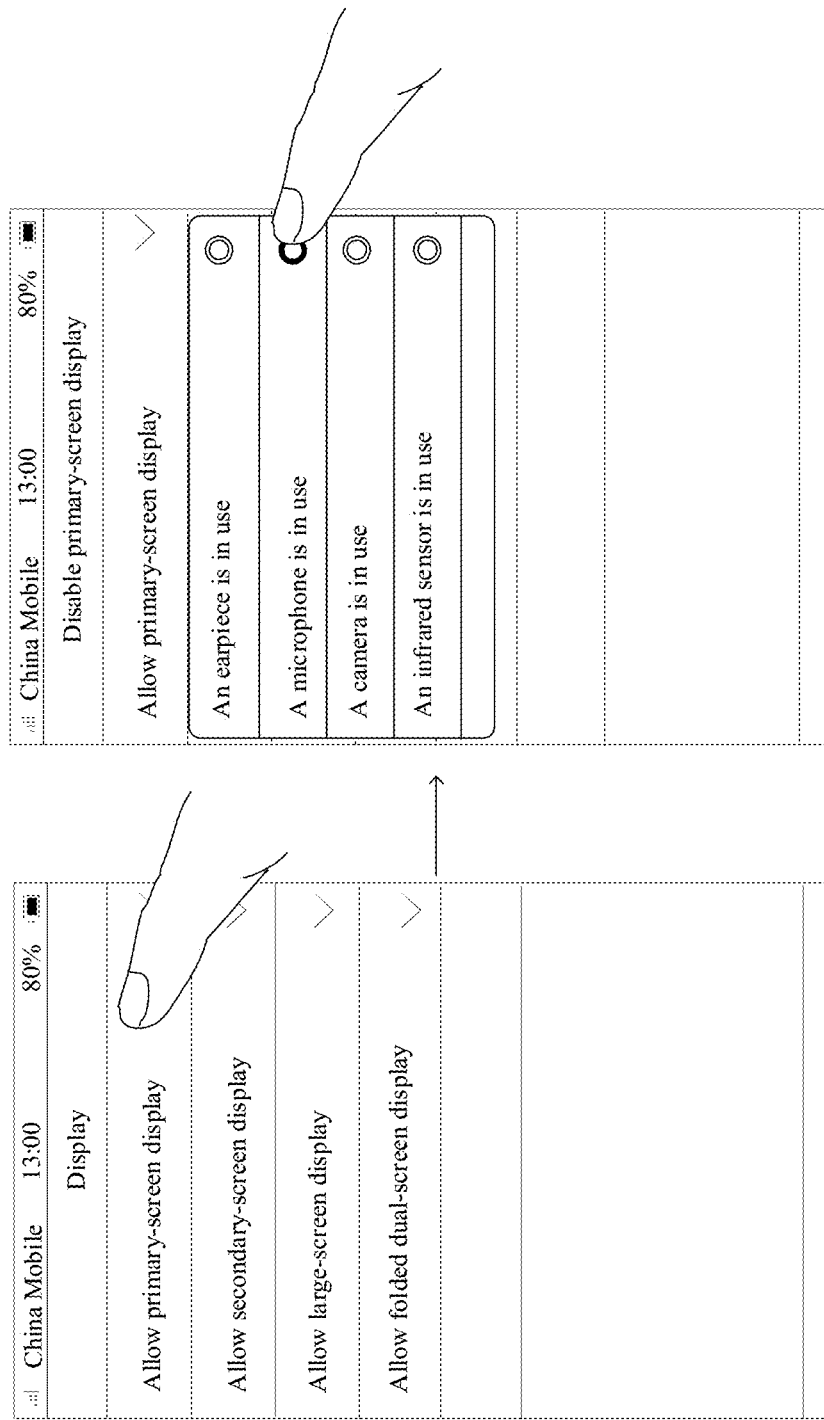

An embodiment of this application further provides a display method, applied to the foregoing electronic device having the foldable screen. The method includes, when a first screen switching event is detected, if the electronic device is displaying an interface of a first application in a first screen-on state, the electronic device is set to a second screen-on state, or if the first electronic device is displaying an interface of a second application in the first screen-on state, the electronic device is set to a third screen-on state. The first application is different from the second application, and the second screen-on state is different from the third screen-on state. Optionally, the first application is a call application or a facial recognition application, and the second screen-on state does not include secondary-screen display. Optionally, the second application is a camera application, and the third screen-on state does not include primary-screen display. It may be understood that, in this solution, based on an application running in the foreground, different screen-on states may be switched to. A correspondence between the application running in the foreground and a screen-on state may be set by a user. For example, a correspondence between an application and a display manner is set by using settings interfaces shown in FIG. 15A to FIG. 15C. Further, the user may first enter a Settings application, and the mobile phone displays a user interface shown in FIG. 15A. When the user selects to display related settings, the mobile phone displays an interface shown in FIG. 15B. The interface displays four options disable primary-screen display, disable secondary-screen display, disable large-screen display, and disable folded dual-screen display. When the user selects the option of "disable primary-screen display", the mobile phone displays an interface shown in FIG. 15C. The interface includes an identifier of the application and a corresponding switch. The user may use the switch to select whether to disable the primary-screen display when the application in the list is running or displayed in the foreground. It may be understood that FIG. 15A to FIG. 15C are merely an example of a settings interface, and another interface may be further used for setting. For example, a display manner in which a prompt is allowed may be set, and the user selects a corresponding application. As shown in FIG. 15D, it indicates that the primary screen is used for display during running of the second application, and the user may select a plurality of applications. Alternatively, for some specific applications, the user selects which display manners (that is, a screen status of the screen) are allowed or prohibited for the application. As shown in FIG. 15E, it indicates that when the first application is running or displayed in the foreground, secondary-screen display is allowed, and the user may select a plurality of display manners at the same time. Alternatively, for different display manners, the user selects a corresponding component. As shown in FIG. 15F, it indicates that the primary-screen display is allowed when an earpiece is enabled, and the user may select a plurality of components at the same time. The application list, the display manner list, or the component list in FIG. 15A to FIG. 15F may be respectively selected by the user from installed applications in the electronic device, supported display manners, or installed components, or may be recommended by the Settings application or an operating system. This is not limited in this embodiment of the present disclosure.

Optionally, the first application starts a first component, and the first component is disposed only on the secondary screen or only on the primary screen. For example, the first component may be a camera located only on the secondary screen.

In some implementations, the user may set that when a Navigation application is running or displayed in the foreground, only the primary-screen display is allowed. Alternatively, the user may set that when a monitor camera application or a driving record application is enabled, only the primary-screen display is allowed, or the like.

After the user completes setting, when a set application is running or displayed in the foreground, it may be determined, based on display settings of the application and a current screen status of the electronic device, whether the current screen status of the electronic device needs to be maintained or the screen status needs to be switched. For example, if the user sets that the first application is allowed to be displayed only in a screen-on state a, when the user starts the first application, the electronic device determines whether the current screen status is the screen-on state a. If yes, the electronic device keeps the screen-on state a, unchanged, and displays the interface of the first application. If no, a screen-on manner a is switched to, and the interface of the first application is displayed.

An embodiment of this application discloses an electronic device, including a processor, and a memory, an input device, and an output device that are coupled to the processor. The input device and the output device may be integrated into one device. For example, a touch panel of a foldable screen may be used as the input device, and a display of the foldable screen may be used as the output device.

Figure 16:
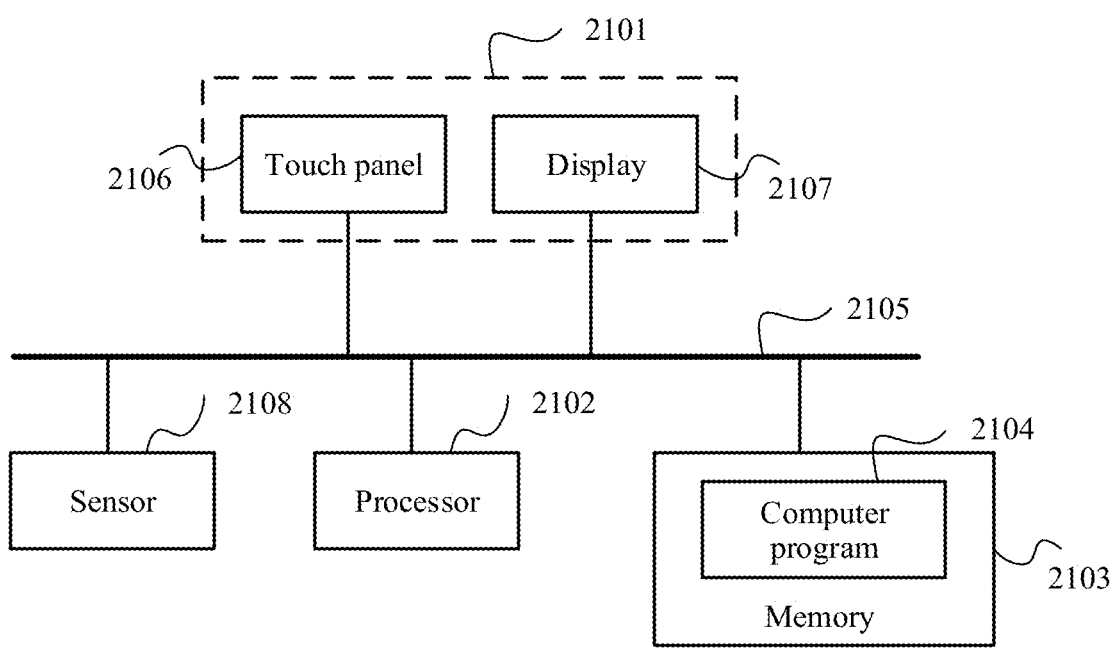
FIG. 16 is a schematic diagram of still another structure of an electronic device according to an embodiment of this application.

In this case, as shown in FIG. 16, the electronic device may include a foldable screen 2101. The foldable screen 2101 includes a touch panel 2106 and a display 2107, one or more processors 2102, one or more memories 2103, one or more sensors 2108, and one or more computer programs 2104. The foregoing components may be coupled through one or more communications buses 2105. The one or more computer programs 2104 are stored in the memory 2103 and are configured to be executed by the one or more processors 2102. The one or more computer programs 2104 include instructions, and the instructions may be used to perform the steps in the foregoing embodiments. All related content of the steps in the foregoing method embodiments may be cited in function descriptions of corresponding physical components. Details are not described herein again.

For example, the processor 2102 may be the processor 110 shown in FIG. 3, the memory 2103 may be the internal memory 121 and/or the external memory 120 shown in FIG. 3, the foldable screen 2101 may be the foldable screen 301 shown in FIG. 3, and the sensor 2108 may be the gyroscope sensor 180B, the acceleration sensor 180E, or the optical proximity sensor 180G that are in the sensor module 180 shown in FIG. 3, or may be one or more of an infrared sensor, a Hall effect sensor, a distance sensor, or the like. This is not limited in this embodiment of this application. The electronic device further includes an earpiece, a microphone, a camera, and the like.

A person skilled in the art may understand that, in the foregoing implementation, a disposed position of the component is merely an example, and this embodiment of the present disclosure may be further applicable to an electronic device in which another component is disposed, for example, an electronic device in which an earpiece is disposed only on a secondary screen, or an electronic device in which a camera is disposed only on a primary screen.

The foregoing descriptions about implementations allow the person skilled in the art to clearly understand that, for the purpose of convenient and brief description, division into the foregoing function modules is used as an example for illustration. In actual application, the foregoing functions can be allocated to different function modules and implemented based on a requirement. That is, an inner structure of an apparatus is divided into different function modules to implement all or some of the functions described above. For detailed working processes of the foregoing system, apparatus, and unit, refer to corresponding processes in the foregoing method embodiments, and details are not described herein again.

Function units in the embodiments of this application may be integrated into one processing unit, or each of the units may exist alone physically, or two or more units are integrated into one unit. The integrated unit may be implemented in a form of hardware, or may be implemented in a form of a software function unit.

When the integrated unit is implemented in the form of a software function unit and sold or used as an independent product, the integrated unit may be stored in a computer-readable storage medium. Based on such an understanding, the technical solutions of the embodiments of this application essentially, or the part contributing to the conventional technology, or all or some of the technical solutions may be implemented in a form of a software product. The computer software product is stored in a storage medium and includes several instructions for instructing a computer device (which may be a personal computer, a server, or a network device) or a processor to perform all or some of the steps of the methods described in the embodiments of this application. The foregoing storage medium includes any medium that can store program code, such as a flash memory, a removable hard disk, a read-only memory (ROM), a RAM, a magnetic disk, or an optical disc.

The foregoing descriptions are merely specific implementations of the embodiments in this application, but are not intended to limit the protection scope of the embodiments in this application. Any variation or replacement within the technical scope disclosed in the embodiments in this application shall fall within the protection scope of the embodiments in this application.

What is claimed is:

1. An electronic device comprising:
a foldable screen, wherein the foldable screen is divided into a primary screen and a secondary screen when the foldable screen is in a folded state;
an earpiece disposed on a first screen, wherein the first screen is the primary screen;
a second component disposed on a second screen, wherein the second screen is the secondary screen;
a memory configured to store instructions; and
a processor coupled to the memory, the earpiece, the second component, and the foldable screen, wherein when executed by the processor, the instructions cause the electronic device to:
detect a screen switching event in a first screen-on state, wherein the first screen-on state comprises a primary-screen display, a large-screen display, or a folded dual-screen display;
set the electronic device to a second screen-on state when a first condition is met, wherein the second screen-on state comprises the primary-screen display, the large-screen display, or the folded dual-screen display, wherein the first condition comprises that the earpiece is in a working state; and
set the electronic device to a third screen-on state when a second condition is met,
wherein the third screen-on state comprises a secondary-screen display, wherein the second condition comprises that either the earpiece is in a non-working state or both the earpiece is in the working state and the second component is in the working state.

2. The electronic device of claim 1, wherein the second component is a camera disposed on the secondary screen, and wherein the first condition further comprises the earpiece being in the working state and the camera being in the non-working state.

3. The electronic device of claim 2, wherein the second condition further comprises the earpiece being in the working state and the camera being in the working state.

4. The electronic device of claim 1, further comprising an intelligent screen switching switch and a camera, wherein the first condition further comprises the earpiece being in the working state, the camera being in the non-working state, and the intelligent screen switching switch being in an enabled state.

5. The electronic device of claim 1, wherein the first screen-on state is different from the second screen-on state and the third screen-on state.

6. The electronic device of claim 1, wherein the first condition further comprises that the second component is in the non-working state.

7. An electronic device comprising:
a foldable screen, wherein the foldable screen is divided into a primary screen and a secondary screen when the foldable screen is in a folded state;
a camera disposed on the secondary screen;
an earpiece disposed on the primary screen;
a memory configured to store instructions;
a processor coupled to the foldable screen, the camera, the earpiece, and the memory, wherein when executed by the processor, the instructions cause the electronic device to:
detect a screen switching event in a first screen-on state or detect a screen-on event when the foldable screen is off;
set the electronic device to a second screen-on state when the electronic device does not use a headset, the electronic device is in a calling state and the camera is in a non-working state; and
set the electronic device to a third screen-on state when the electronic device is in the calling state and the camera is in a working state,
wherein the second screen-on state is different from the third screen-on state,
wherein the second screen-on state does not comprise a secondary-screen display, and
wherein the third screen-on state comprises the secondary-screen display.

8. An electronic device comprising:
a foldable screen, wherein the foldable screen is divided into a primary screen and a secondary screen when the foldable screen is in a folded state;
a camera disposed on a first screen, wherein the first screen is the secondary screen;
a second component disposed on a second screen, wherein the second component is an earpiece, a microphone, an infrared sensor, or an optical proximity sensor, wherein the second screen is the primary screen;
a memory configured to store instructions; and
a processor coupled to the memory, the camera, the second component, and the foldable screen, wherein when executed by the processor, the instructions cause the electronic device to:
detect a screen switching event in a first screen-on state, wherein the first screen-on state comprises a primary-screen display, a secondary-screen display, a large-screen display, or a folded dual-screen display;
set the electronic device to a second screen-on state when a first condition is met, wherein the second screen-on state comprises the secondary-screen display, the large-screen display, or the folded dual-screen display, wherein the first condition comprises that the camera is in a working state; and
set the electronic device to a third screen-on state when a second condition is met, wherein the third screen-on state comprises the primary-screen display, wherein the second condition comprises that either the camera is in a non-working state or both the camera is in the working state and the second component is in the working state,
wherein the first screen-on state is different from the second screen-on state and the third screen-on state.

9. The electronic device of claim 8, wherein the first condition further comprises that the second component is in the non-working state.

10. An electronic device comprising:
a foldable screen, wherein the foldable screen is divided into a primary screen and a secondary screen when the foldable screen is in a folded state;
a first component disposed on a first screen, wherein the first screen is one of the primary screen or the secondary screen, wherein the first component is a microphone or an infrared sensor;

a second component disposed on a second screen, wherein the second screen is one of the primary screen or the secondary screen and is different than the first screen;

a memory configured to store instructions; and a processor coupled to the memory, the first component, the second component, and the foldable screen, wherein when executed by the processor, the instructions cause the electronic device to:

detect a screen switching event in a first screen-on state;

set the electronic device to a second screen-on state when a first condition is met, wherein the first condition comprises that the first component is in a working state; and set the electronic device to a third screen-on state when a second condition is met, wherein the second condition comprises that either the first component is in a non-working state or both the first component is in the working state and the second component is in the working state, wherein the second screen-on state is different from the third screen-on state.

11. The electronic device of claim 10, wherein the first condition further comprises that the second component is in the non-working state.

12. The electronic device of claim 10, wherein the first component is disposed on the primary screen, wherein the second screen-on state does not comprise a secondary-screen display, and wherein the third screen-on state comprises the secondary-screen display.

13. The electronic device of claim 12, wherein the first component is the microphone.

14. The electronic device of claim 13, wherein the second component is a camera disposed on the secondary screen, wherein the first condition further comprises the microphone being in the working state and the camera being in the non-working state.

15. The electronic device of claim 14, further comprising an earpiece, wherein the second condition further comprises the earpiece being in the working state and the camera being in the working state.

16. The electronic device of claim 12, wherein the first component is the infrared sensor.

17. The electronic device of claim 16, wherein the second component is a camera disposed on the secondary screen, wherein the first condition further comprises the infrared sensor being in the working state and the camera being in the non-working state.

18. The electronic device of claim 17, wherein the second condition further comprises the infrared sensor being in the working state and the camera being in the working state.

19. An electronic device comprising:

a foldable screen, wherein the foldable screen is divided into a primary screen and a secondary screen when the foldable screen is in a folded state;

an intelligent screen switching switch;

an earpiece disposed on a first screen, wherein the first screen is the primary screen;

a camera disposed on a second screen, wherein the second screen is the secondary screen;

a memory configured to store instructions; and a processor coupled to the memory, the earpiece, the camera, and the foldable screen, wherein when executed by the processor, the instructions cause the electronic device to:

detect a screen switching event in a first screen-on state;

set the electronic device to a second screen-on state when a first condition is met, wherein the second screen-on state does not comprise a secondary-screen display, wherein the first condition comprises that the earpiece is in a working state, the camera being in a non-working state, and the intelligent screen switching switch being in an enabled state; and set the electronic device to a third screen-on state when a second condition is met, wherein the third screen-on state comprises the secondary-screen display, wherein the second condition comprises that either the earpiece is in the non-working state or both the earpiece is in the working state and the camera is in the working state.

* * * * *

UNITED STATES PATENT AND TRADEMARK OFFICE
CERTIFICATE OF CORRECTION

| | | |
|---|---|---|
| PATENT NO. | : 12,101,424 B2 | Page 1 of 1 |
| APPLICATION NO. | : 17/682182 | |
| DATED | : September 24, 2024 | |
| INVENTOR(S) | : Xinglong Pan and Zhen Li | |

It is certified that error appears in the above-identified patent and that said Letters Patent is hereby corrected as shown below:

On the Title Page

(56) References Cited, Foreign Patent Documents: "CN 2016062110 A 4/2016" should read "JP 2016062110 A 4/2016"

Signed and Sealed this
Twenty-second Day of October, 2024

Katherine Kelly Vidal
*Director of the United States Patent and Trademark Office*